(12) United States Patent
Lee et al.

(10) Patent No.: US 11,581,050 B2
(45) Date of Patent: Feb. 14, 2023

(54) MEMORY DEVICE AND METHOD OF OPERATING THE MEMORY DEVICE

(71) Applicant: SK hynix Inc., Icheon-si Gyeonggi-do (KR)

(72) Inventors: Dong Uk Lee, Icheon-si Gyeonggi-do (KR); Hae Chang Yang, Icheon-si Gyeonggi-do (KR); Hun Wook Lee, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 10 days.

(21) Appl. No.: 17/357,488

(22) Filed: Jun. 24, 2021

(65) Prior Publication Data

US 2022/0189568 A1    Jun. 16, 2022

(30) Foreign Application Priority Data

Dec. 16, 2020 (KR) .................. 10-2020-0176723

(51) Int. Cl.
*G11C 16/34* (2006.01)
*G11C 16/04* (2006.01)
(Continued)

(52) U.S. Cl.
CPC ...... *G11C 16/3459* (2013.01); *G11C 16/0433* (2013.01); *G11C 16/08* (2013.01);
(Continued)

(58) Field of Classification Search
CPC ............ G11C 16/3459; G11C 16/0433; G11C 16/08; G11C 16/102; G11C 16/28; G11C 16/30
See application file for complete search history.

(56) References Cited

U.S. PATENT DOCUMENTS

| 8,743,612 B2* | 6/2014 | Choi | ................ | G11C 16/0483 365/185.11 |
| 8,817,539 B2* | 8/2014 | Choi | ................ | G11C 16/3427 365/185.11 |

(Continued)

FOREIGN PATENT DOCUMENTS

KR   1020190131898 A    11/2019

OTHER PUBLICATIONS

Akira God, 3-D NAND Technology Achievements and Future Scaling Perspectives, IEEE Transactions on Electron Devices, vol. 67, No. 4, Apr. 2020, pp. 1373-1381.

Dae Woong Kwon et al., Analysis on New Read Disturbance Induced by Hot Carrier Injections in 3-D Channel-Stacked NAND Flash Memory, IEEE Transactions on Electron Devices, vol. 66, No. 8, Aug. 2019, pp. 3326-3330.

(Continued)

*Primary Examiner* — Tri M Hoang
(74) *Attorney, Agent, or Firm* — William Park & Associates Ltd.

(57) ABSTRACT

The present technology relates to an electronic device. A memory device that controls a voltage applied to each line to prevent or mitigate a channel negative boosting phenomenon during a sensing operation includes a memory block connected to a plurality of lines, a peripheral circuit configured to perform a sensing operation on selected memory cells connected to a selected word line among the plurality of lines, and control logic configured to control voltages applied to drain select lines, source select lines, and word lines between the drain select lines and the source select lines among the plurality of lines, during the sensing operation and an equalizing operation performed after the sensing operation. The control logic controls a voltage applied to an unselected drain select line according to whether a cell string (Continued)

is shared with a selected drain select line among the drain select lines, during the sensing operation.

20 Claims, 19 Drawing Sheets

(51) Int. Cl.
   *G11C 16/08* (2006.01)
   *G11C 16/10* (2006.01)
   *G11C 16/28* (2006.01)
   *G11C 16/30* (2006.01)

(52) U.S. Cl.
   CPC ............ *G11C 16/102* (2013.01); *G11C 16/28* (2013.01); *G11C 16/30* (2013.01)

(56) References Cited

U.S. PATENT DOCUMENTS

| | | | |
|---|---|---|---|
| 9,047,971 B2* | 6/2015 | Mokhlesi | G11C 16/26 |
| 9,117,540 B2* | 8/2015 | Shim | G11C 16/3427 |
| 9,520,198 B2* | 12/2016 | Choi | G11C 16/24 |
| 9,805,797 B2* | 10/2017 | Hosono | G11C 16/08 |
| 10,262,703 B2 | 4/2019 | Shimura et al. | |
| 10,566,059 B2* | 2/2020 | Diep | H01L 29/42344 |
| 10,607,688 B2* | 3/2020 | Shin | G11C 8/08 |
| 10,790,024 B2* | 9/2020 | Joo | G11C 8/08 |

OTHER PUBLICATIONS

Sangwoo Han et al., Study on Natural Local Self Boosting of Down Coupling Phenomenon According to the Number of Word Line in 3D NAND Flash Memory, The Institute of Electronics and Information Engineers, pp. 205-208, Nov. 2019.

Shyam Raghunathan (Invited) 3D-NAND Reliability: Review of Key machanisms and mitigations, IEEE Electron Devices Technology and Manufacturing Conference Proceedings of Technical Papers (EDTM), Jun. 2020.

Wei-Liang Lin et al., Hot-Carrier Injection-Induced Disturb and Improvement Methods in 3D NAND Flash Memory, IEEE 2019 International Symposium on VLSI Technology, Systems and Application (VLSI-TSA), Aug. 2019.

Yoon Kim et al., Down-Coupling Phenomenon of Floating Channel in 3D NAND Flash Memory, IEEE Electron Device Letters, vol. 37, No. 12, Dec. 2016, pp. 1566-1569.

* cited by examiner

MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2020-0176723, filed on Dec. 16, 2020, in the Korean Intellectual Property Office, the entire disclosure of which is incorporated herein by reference.

BACKGROUND

1. Technical Field

The present disclosure relates to an electronic device, and more particularly, to a memory device and a method of operating the memory device.

2. Related Art

A storage device is a device that stores data under control of a host device such as a computer, a smart phone, or a smart pad. The storage device includes a device that stores data in a magnetic disk such as a hard disk drive (HDD), a device that stores data in a semiconductor memory such as a solid state drive (SSD), or a memory card, in particular, a nonvolatile memory.

The storage device may include a memory device in which data is stored and a memory controller that stores data in the memory device. The memory device may be classified into a volatile memory and a nonvolatile memory. Here, the nonvolatile memory includes a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like.

SUMMARY

According to an embodiment of the present disclosure, a memory device may include a memory block connected to a plurality of lines, a peripheral circuit configured to perform a sensing operation on selected memory cells connected to a selected word line among the plurality of lines, and control logic configured to control voltages applied to drain select lines, source select lines, and word lines between the drain select lines and the source select lines among the plurality of lines, during the sensing operation and an equalizing operation performed after the sensing operation. The control logic may control a voltage applied to an unselected drain select line according to whether a cell string is shared with a selected drain select line among the drain select lines, during the sensing operation.

According to an embodiment of the present disclosure, a memory device may include a memory block connected to a plurality of lines, a peripheral circuit configured to perform a sensing operation on selected memory cells connected to a selected word line among the plurality of lines, a drain select line controller configured to control voltages applied to drain select lines among the plurality of lines, during the sensing operation and an equalizing operation performed after the sensing operation, a source select line controller configured to control voltages applied to source select lines among the plurality of lines, a word line controller configured to control a voltage applied to word lines between the drain select lines and the source select lines among the plurality of lines, and a dummy line controller configured to control a voltage applied to a center dummy line positioned in a middle of the word lines, when the memory block has a plurality of stack structures. The drain select line controller may control a voltage applied to an unselected drain select line according to whether a cell string is shared with a selected drain select line among the drain select lines, during the sensing operation.

According to an embodiment of the present disclosure, a method of operating a memory device including a memory block connected to a plurality of lines may include applying a sensing voltage to a selected word line and applying pass voltages to unselected word lines among the plurality of lines in order to perform a sensing operation of sensing selected memory cells connected to the selected word line among the plurality of lines, and applying voltages to drain select lines among the plurality of lines, when applying the sensing voltage and the pass voltage. A voltage applied to an unselected drain select line may be set differently according to whether a cell string is shared with a selected drain select line among the drain select lines.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

An embodiment of the present disclosure provides a memory device that controls a voltage applied to each line to prevent or mitigate a channel negative boosting phenomenon during a sensing operation, and a method of operating the memory device.

According to the present technology, a channel negative disturb phenomenon may be prevented, or in some embodiments mitigated, by determining a method of decreasing a potential according to whether the drain select line shares the cell string before the equalizing operation during the sensing operation and determining a method of setting a potential of the word lines during the equalizing operation.

Figure 1:
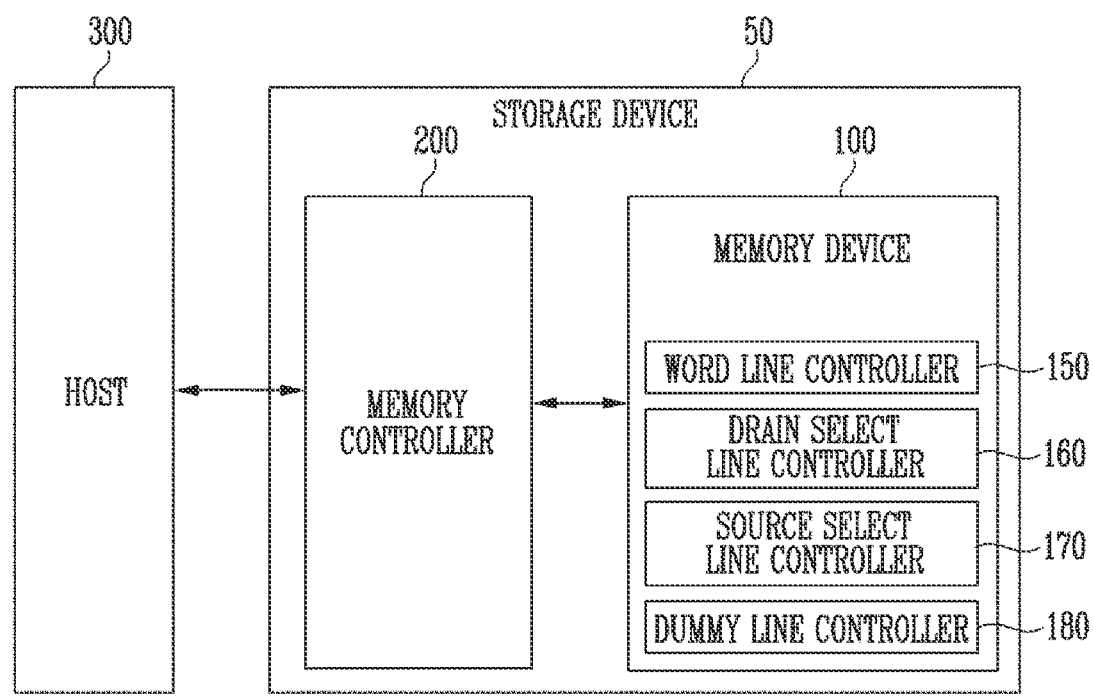
FIG. 1 is a block diagram illustrating a storage device.

FIG. 1 is a block diagram illustrating a storage device.

Referring to FIG. 1, the storage device 50 may include a memory device 100 and a memory controller 200.

The storage device 50 may be a device that stores data under control of a host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host 300. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates in response to control of the memory controller 200. The memory device 100 may include a memory cell array including a plurality of memory cells storing the data. The memory cell array may include a plurality of memory blocks. Each of the memory blocks may include a plurality of memory cells, and the plurality of memory cells may configure a plurality of pages. In an embodiment, a page may be a unit for storing data in the memory device 100 or reading data stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. In the present specification, for convenience of description, it is assumed that the memory device 100 is a NAND flash memory.

The memory device 100 may be implemented as a two-dimensional array structure or a three-dimensional array structure. Hereinafter, the three-dimensional array structure is described as an embodiment, but the present disclosure is not limited to the three-dimensional array structure. The present disclosure may be applied not only to a flash memory device in which a charge storage layer is configured of a conductive floating gate (FG), but also to a charge trap flash (CTF) in which the charge storage layer is configured of an insulating film.

In an embodiment, the memory device 100 may operate in a single level cell (SLC) method in which one data bit is stored in one memory cell. Alternatively, the memory device 100 may operate in a method of storing at least two data bits in one memory cell. For example, the memory device 100 may operate in a multi-level cell (MLC) method of storing two data bits in one memory cell, a triple level cell (TLC) method of storing three data bits in one memory cell, or a quadruple level cell (QLC) method of storing four data bits in one memory cell.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a write operation (program operation), a read operation, or an erase operation according to the received command. For example, when a program command is received, the memory device 100 may program data to the area selected by the address. When a read command is received, the memory device 100 may read data from the area selected by the address. When an erase command is received, the memory device 100 may erase data stored in the area selected by the address.

In an embodiment, the memory device 100 may include a word line controller 150. When the memory device 100 performs a sensing operation, the word line controller 150 may control a voltage applied to a selected word line and unselected word lines. Here, the sensing operation may be the read operation or a verify operation among operations included in a program loop.

For example, during the sensing operation, a sensing voltage may be applied to the selected word line and a pass voltage may be applied to the unselected word lines. Thereafter, when sensing is completed, an equalizing operation may be performed. The equalizing operation may be an operation of setting identically potentials of the selected word line and the unselected word lines. That is, after the sensing voltage is applied to the selected word line and the pass voltage is applied to the unselected word lines, the selected word line and the unselected word lines may be simultaneously discharged in a state in which the potentials of the selected word line and the unselected word lines are identically set. The words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place.

Since the selected word line and the unselected word lines are simultaneously discharged, the potentials of the selected word line and the unselected word lines may simultaneously become a ground voltage level. Therefore, the potentials of the selected word line and the unselected word lines may be prevented, or in some embodiments mitigated, from being changed due to the discharge of the selected word line and the unselected word lines.

In an embodiment, during the equalizing operation, the word line controller 150 may control the potentials of the selected word line and the unselected word lines to be the same by increasing the voltage of the selected word line and decreasing the voltage of the unselected word line.

In an embodiment, the memory device 100 may include a drain select line controller 160 and a source select line controller 170. During the sensing operation, the drain select line controller 160 may control a voltage applied to a drain select line among lines connected to the memory block, and the source select line controller 170 may control a voltage applied to a source select line among the lines connected to the memory block.

For example, the drain select line controller 160 may control application of a voltage to be applied to the drain select lines by dividing the drain select lines into two different groups, for example the two groups may be selected drain select lines and unselected drain select lines. Then based on what group the drain select line is within the drain select line controller 160 may apply the voltage assigned to that group. In an embodiment, the drain select lines may be divided into more than two different groups.

For example, the drain select line controller 160 may apply a voltage for turning on a transistor connected to the selected drain select line, to the selected drain select line during the sensing operation. The drain select line controller 160 may control the voltage applied to the selected drain select line to be maintained until a preset time after the equalizing operation.

In addition, the drain select line controller 160 may control the voltage applied to the unselected drain select lines according to whether the unselected drain select lines share a cell string with the selected drain select line. At this time, the selected drain select line and the unselected drain select line sharing the cell string may be lines connected to the cell string through one source select line, and the selected drain select line and the unselected drain select line which do not share the cell string may be lines which are not connected to the cell string through one source select line.

For example, during the sensing operation, when the unselected drain select lines share the cell string with the selected drain select line, the drain select line controller 160 may sequentially decrease the voltage of the unselected drain select lines. However, when the unselected drain select lines do not share the cell string with the selected drain select line, the drain select line controller 160 may apply the voltage to the unselected drain select lines only while the sensing voltage is applied to the selected word line.

In an embodiment, the source select line controller 170 may apply a voltage for turning on a transistor connected to the selected source select line, to the selected source select line during the sensing operation. The source select line controller 170 may control the voltage applied to the selected source select line to be maintained until a preset time after the equalizing operation.

In an embodiment, the memory device 100 may include a dummy line controller 180. When the drain select line controller 160 applies the voltage to the unselected drain select lines which do not share the cell string with the selected drain select line, the dummy line controller 180 may apply a voltage for turning off dummy memory cells connected to a dummy line.

The memory controller 200 may control an overall operation of the storage device 50.

When a power voltage is applied to the storage device 50, the memory controller 200 may execute firmware. When the memory device 100 is a flash memory device 100, the memory controller 200 may operate firmware such as a flash translation layer (FTL) for controlling communication between the host 300 and the memory device 100.

In an embodiment, the memory controller 200 may include firmware (not shown) that may receive data and a logical block address (LBA) from the host 300 and translate the LBA into a physical block address (PBA) indicating an address of memory cells in which data included in the memory device 100 is to be stored. In addition, the memory controller 200 may store a logical-physical address mapping table configuring a mapping relationship between the LBA and the PBA in a buffer memory.

The memory controller 200 may control the memory device 100 to perform the program operation, the read operation, the erase operation, or the like according to the request of the host 300. For example, when a program request is received from the host 300, the memory controller 200 may convert the program request into a program command, and may provide the program command, the PBA, and data to the memory device 100. When a read request is received from the host 300 together with the LBA, the memory controller 200 may change the read request into a read command, select a PBA corresponding to the LBA, and then provide the read command and the PBA to the memory device 100. When an erase request is received from the host 300 together with the LBA, the memory controller 200 may change the erase request into an erase command, select a PBA corresponding to the LBA, and then provide the erase command and the PBA to the memory device 100.

In an embodiment, the memory controller 200 may generate and transmit the program command, the address, and the data to the memory device 100 without the request from the host 300. For example, the memory controller 200 may provide the command, the address, and the data to the memory device 100 to perform background operations such as a program operation for wear leveling and a program operation for garbage collection.

In an embodiment, the storage device 50 may further include a buffer memory (not shown). The memory controller 200 may control data exchange between the host 300 and the buffer memory (not shown). Alternatively, the memory controller 200 may temporarily store system data for controlling the memory device 100 in the buffer memory. For example, the memory controller 200 may temporarily store data input from the host 300 in the buffer memory, and then transmit data temporarily stored in the buffer memory to the memory device 100.

In various embodiments, the buffer memory may be used as an operation memory and a cache memory of the memory controller 200. The buffer memory may store codes or commands executed by the memory controller 200. Alternatively, the buffer memory may store data processed by the memory controller 200.

In an embodiment, the buffer memory may be implemented as a dynamic random access memory (DRAM) such as a double data rate synchronous dynamic random access memory (DDR SDRAM), a DDR4 SDRAM, a low power double data rate4 (LPDDR4) SDRAM, a graphics double data rate (GDDR) SDRAM, a low power DDR (LPDDR), or Rambus dynamic random access memory (DRAM), or a static random access memory (SRAM).

In various embodiments, the buffer memory may be connected from an outside of the storage device 50. In this case, the volatile memory devices connected to the outside of the storage device 50 may serve as the buffer memory.

In an embodiment, the memory controller 200 may control at least two or more memory devices. In this case, the memory controller 200 may control the memory devices according to an interleaving method in order to improve operation performance.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
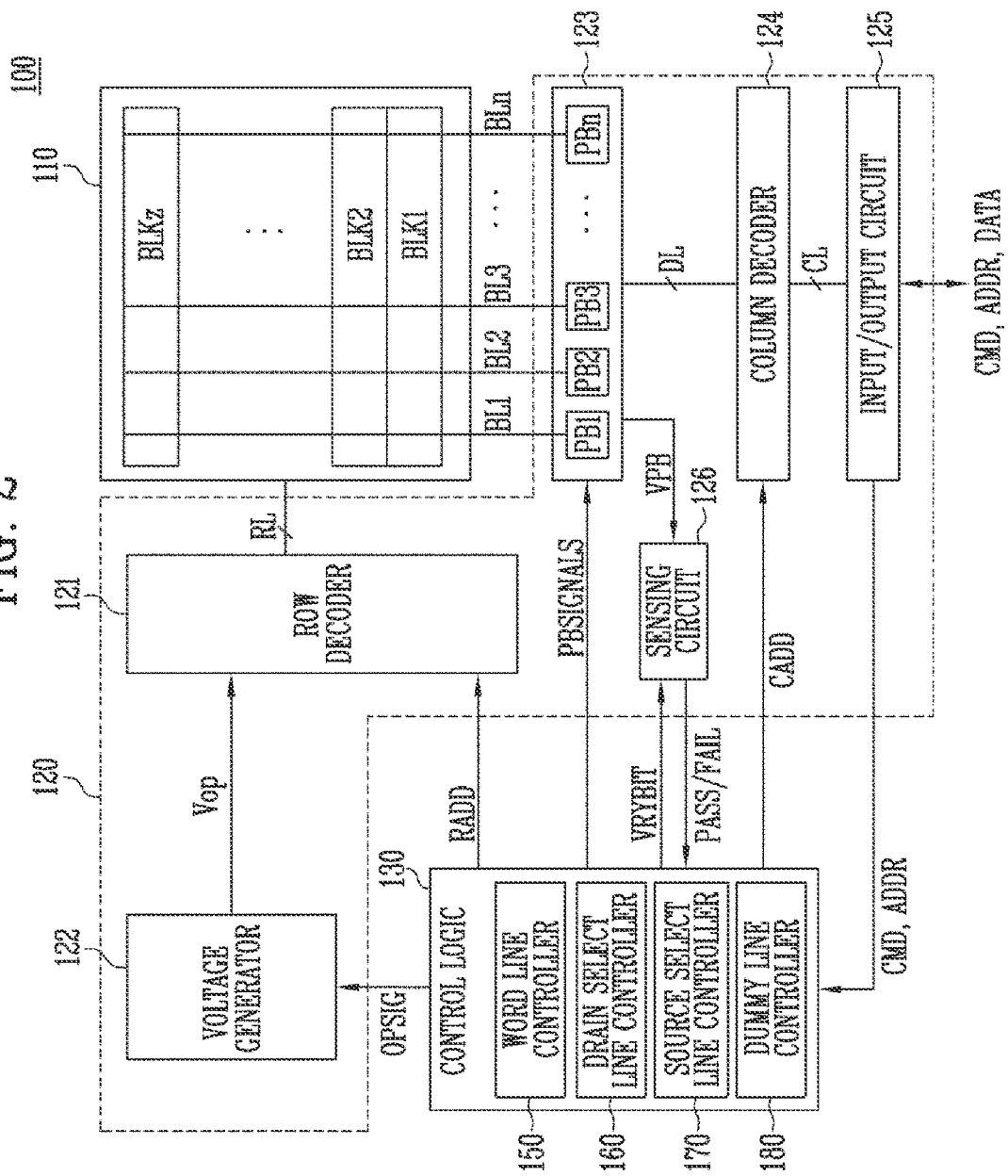
FIG. 2 is a diagram illustrating a structure of a memory device of FIG. 1.

FIG. 2 is a diagram illustrating a structure of the memory device of FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz may be connected to the page buffer group 123 through bit lines BL1 to BLn. Each of the plurality of memory blocks BLK1 to BLKz includes a plurality of memory cells. As an embodiment, the plurality of memory cells are nonvolatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a single level cell (SLC) that stores one data bit, a multi-level cell (MLC) that stores two data bits, a triple level cell (TLC) that stores three data bits, or a quadruple level cell (QLC) that stores four data bits.

The peripheral circuit 120 may be configured to perform the program operation, the read operation, or the erase operation on a selected area of the memory cell array 110 under control of the control logic 130. The peripheral circuit 120 may drive the memory cell array 110. For example, the peripheral circuit 120 may apply various operation voltages to the row lines RL and the bit lines BL1 to BLn or discharge the applied voltages under the control of the control logic 130.

The peripheral circuit 120 may include a row decoder 121, a voltage generator 122, the page buffer group 123, a column decoder 124, an input/output circuit 125, and a sensing circuit 126.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to decode a row address RADD received from the control logic 130. The row decoder 121 selects at least one memory block among the memory blocks BLK1 to BLKz according to a decoded address. In addition, the row decoder 121 may select at least one word line of the memory block selected to apply the voltages generated by the voltage generator 122 to at least one word line WL according to the decoded address.

For example, during the program operation, the row decoder 121 may apply a program voltage to a selected word line and apply a program pass voltage of a level lower than the program voltage to an unselected word line. During a program verify operation, the row decoder 121 may apply a verify voltage to the selected word line and a verify pass voltage higher than the verify voltage to the unselected word line. During the read operation, the row decoder 121 may apply a read voltage to the selected word line and apply a read pass voltage higher than the read voltage to the unselected word line.

In an embodiment, the erase operation of the memory device 100 is performed in a memory block unit. During the erase operation, the row decoder 121 may select one memory block according to the decoded address. During the erase operation, the row decoder 121 may apply a ground voltage to the word lines connected to the selected memory block.

The voltage generator 122 operates in response to the control of the control logic 130. The voltage generator 122 is configured to generate a plurality of voltages using an external power voltage supplied to the memory device 100. For example, the voltage generator 122 may generate various operation voltages Vop used for the program, read, and erase operations, in response to an operation signal OPSIG. For example, the voltage generator 122 may generate the program voltage, the verify voltage, the pass voltage, the read voltage, the erase voltage, and the like in response to the control of the control logic 130.

As an embodiment, the voltage generator 122 may generate an internal power voltage by regulating the external power voltage. The internal power voltage generated by the voltage generator 122 is used as an operation voltage of the memory device 100.

As an embodiment, the voltage generator 122 may generate a plurality of voltages using the external power voltage or the internal power voltage.

For example, the voltage generator 122 may include a plurality of pumping capacitors that receive the internal power voltage, and may selectively activate the plurality of pumping capacitors to generate the plurality of voltages, in response to the control of the control logic 130.

The generated plurality of voltages may be supplied to the memory cell array 110 by the row decoder 121.

The page buffer group 123 includes first to n-th page buffers PB1 to PBn. The first to n-th page buffers PB1 to PBn are connected to the memory cell array 110 through the first to n-th bit lines BL1 to BLn, respectively. The first to n-th page buffers PB1 to PBn operate in response to the control of the control logic 130. For example, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read or verify operation.

For example, during the program operation, when the program voltage is applied to the selected word line, the first to n-th page buffers PB1 to PBn may transfer data DATA received through the input/output circuit 125 to the selected memory cells through the first to n-th bit lines BL1 to BLn. The memory cells of the selected page are programmed according to the transferred data DATA. During the program verify operation, the first to n-th page buffers PB1 to PBn may read page data by sensing the voltage or the current received from the selected memory cells through the first to n-th bit lines BL1 to BLn.

During the read operation, the first to n-th page buffers PB1 to PBn read the data DATA from the memory cells of the selected page through the first to n-th bit lines BL1 to BLn, and outputs the read data DATA to the input/output circuit 125 under control of the column decoder 124.

During the erase operation, the first to n-th page buffers PB1 to PBn may float the first to n-th bit lines BL1 to BLn or apply the erase voltage.

The column decoder 124 may transfer data between the input/output circuit 125 and the page buffer group 123 in response to a column address CADD. For example, the column decoder 124 may exchange data with the first to n-th page buffers PB1 to PBn through data lines DL, or may exchange data with the input/output circuit 125 through column lines CL.

The input/output circuit 125 may transfer the command CMD and the address ADDR received from the memory controller 200 of FIG. 1 described with reference to FIG. 1 to the control logic 130, or may exchange data DATA with the column decoder 124.

The sensing circuit 126 may generate a reference current in response to a permission bit signal VRYBIT during the read operation or the verify operation, and compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the permission bit VRYBIT in response to the command CMD and the address ADDR to control the peripheral circuit 120. For example, the control logic 130 may control the read operation of the selected memory block in response to a sub block read command and the address. In addition, the control logic 130 may control the erase operation of the selected sub block included in the selected memory block in response to the sub block erase command and the address. In addition, the control logic 130 may determine whether the verity operation is passed or failed in response to the pass signal PASS or the fail signal FAIL.

In an embodiment, the control logic 130 may include the word line controller 150, the drain select line controller 160, the source select line controller 170, and the dummy line controller 180. In another embodiment, the word line controller 150, the drain select line controller 160, the source select line controller 170, and the dummy line controller 180 may be positioned outside the control logic 130. Each of the word line controller 150, the drain select line controller 160, the source select line controller 170, and the dummy line controller 180 may output an operation signal OPSIG for controlling a voltage applied to lines, and the voltage generator 122 may generate the various operation voltages Vop used for the sensing operation, based on the operation signal OPSIG.

In an embodiment, when the memory device 100 performs the sensing operation, the word line controller 150 may control the voltage applied to the selected word line and the unselected word lines. For example, the word line controller 150 may control the voltage applied to the selected word line and the unselected word lines during the equalizing operation. Here, equalizing operation may be an operation of setting identically the potentials of the selected word line and the unselected word lines.

In an embodiment, when the memory device 100 performs the sensing operation, the drain select line controller 160 and the source select line controller 170 may control the voltage applied to the drain select lines and the source select lines. For example, during the sensing operation, the drain select line controller 160 and the source select line controller 170 may control to maintain the voltage applied to each of the selected drain select line and the selected source select line for a preset time after the equalizing operation. The word "preset" as used herein with respect to a parameter, such as a preset time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Furthermore, the drain select line controller 160 may control the voltage applied to the unselected drain select lines according to whether the unselected drain select lines share the cell string with the selected drain select line. At this time, the selected drain select line and the unselected drain select line sharing the cell string may be lines connected to the cell string through one source select line, and the selected drain select line and the unselected drain select line which do not share the cell string may be lines which are not connected to the cell string through one source select line.

For example, during the sensing operation, the drain select line controller 160 may sequentially decrease the voltage applied to the unselected drain select lines sharing the cell string with the selected drain select line.

However, in a case of the unselected drain select lines that which do not share the cell string with the selected drain select line, the drain select line controller 160 may control the unselected drain select lines so that the voltage is applied to the unselected drain select lines only while the read voltage is applied to the selected word line.

In addition, during the equalizing operation, the drain select line controller 160 may control the unselected drain select lines so that the voltage is applied to the unselected drain select lines for a preset time after the equalizing operation.

In an embodiment, the dummy line controller 180 may control the dummy line so that a voltage for turning off dummy cells connected to the dummy line is applied to the dummy line only when the voltage is applied to the unselected drain select lines which do not share the cell string with the selected drain select line.

Through the above operation, channel negative boosting may be prevented, or in some embodiments mitigated.

Figure 3:
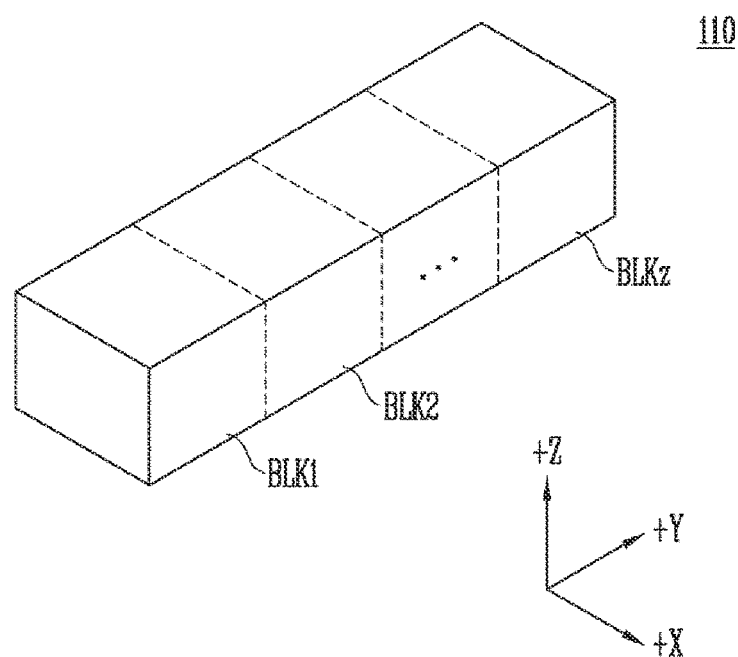
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 includes a plurality of memory blocks BLK1 to BLKz. Each memory block may have a three-dimensional structure. Each memory block includes a plurality of memory cells stacked on a substrate. Such plurality of memory cells are arranged along a +X direction, a +Y direction, and a +Z direction. A structure of each memory block is described in more detail with reference to FIGS. 4 and 5.

Figure 4:
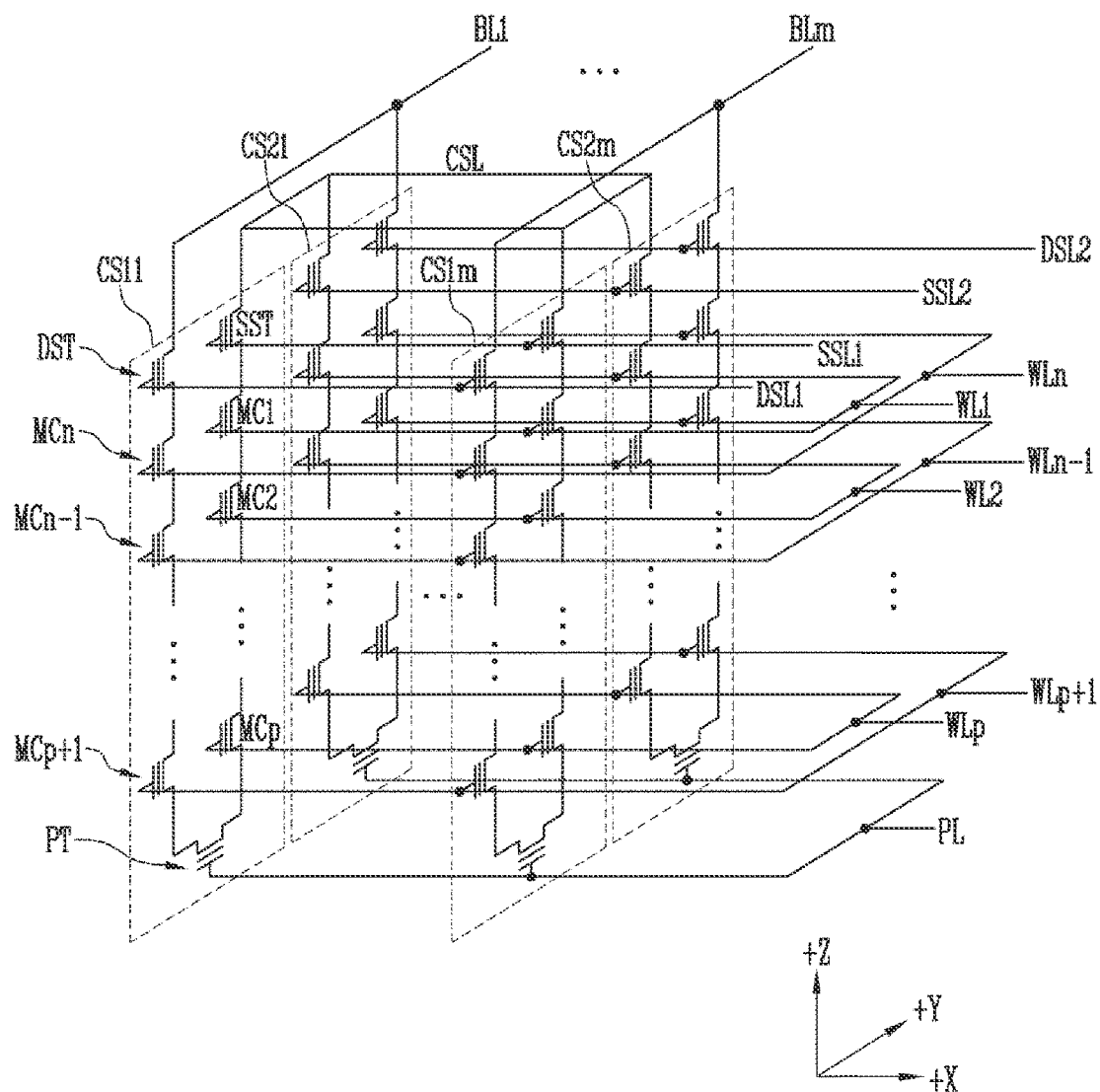
FIG. 4 is a circuit diagram illustrating any one memory block BLKa among memory blocks BLK1 to BLKz of FIG. 3.

FIG. 4 is a circuit diagram illustrating any one memory block BLKa among the memory blocks BLK1 to BLKz of FIG. 3.

Referring to FIG. 4, the memory block BLKa includes a plurality of cell strings CS11 to CS1$m$ and CS21 to CS2$m$. As an embodiment, each of the plurality of cell strings CS11 to CS1$m$ and CS21 to CS2$m$ may be formed in a 'U' shape. In the memory block BLKa, m cell strings are arranged in a row direction (that is, the +X direction). In FIG. 4, two cell strings are arranged in a column direction (that is, the +Y direction). However, this is for convenience of description and it may be understood that three or more cell strings may be arranged in the column direction.

Each of the plurality of cell strings CS11 to CS1$m$ and CS21 to CS2$m$ includes at least one source select transistor SST, first to n-th memory cells MC1 to MCn, a pipe transistor PT, and at least one drain select transistor DST.

The source select transistor SST of each cell string is connected between a common source line CSL and the memory cells MC1 to MCp.

As an embodiment, the source select transistors of the cell strings arranged in the same row are connected to a source select line extending in the row direction, and the source select transistors of the cell strings arranged in different rows are connected to different source select lines. In FIG. 4, the source select transistors of the cell strings CS11 to CS1$m$ of a first row are connected to a first source select line SSL1. The source select transistors of the cell strings CS21 to CS2$m$ of a second row are connected to a second source select line SSL2.

As another embodiment, the source select transistors of the cell strings CS11 to CS1$m$ and CS21 to CS2$m$ may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The cell strings arranged in the row direction are connected to the drain select line extending in the row direction. The drain select transistors of the cell strings CS11 to CS1$m$ of the first row are connected to a first drain select line DSL1. The drain select transistors of the cell strings CS21 to CS2$m$ of the second row are connected to a second drain select line DSL2.

The cell strings arranged in the column direction are connected to the bit lines extending in the column direction. In FIG. 4, the cell strings CS11 and CS21 of the first column are connected to the first bit line BL1. The cell strings CS1$m$ and CS2$m$ of the m-th column are connected to the m-th bit line BLm.

The memory cells connected to the same word line in the cell strings arranged in the row direction configure one page. For example, the memory cells connected to the first word line WL1, among the cell strings CS11 to CS1$m$ of the first row configure one page. The memory cells connected to the first word line WL1, among the cell strings CS21 to CS2$m$ of the second row configure another page. The cell strings arranged in one row direction may be selected by selecting any one of the drain select lines DSL1 and DSL2. One page of the selected cell strings may be selected by selecting any one of the word lines WL1 to WLn.

As another embodiment, even bit lines and odd bit lines may be provided instead of the first to m-th bit lines BL1 to BLm. In addition, even-numbered cell strings among the cell strings CS11 to CS1$m$ or CS21 to SC2$m$ arranged in the row direction may be connected to the even bit lines, and odd-numbered cell strings among the cell strings CS11 to CS1$m$ or CS21 to CS2$m$ arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation for the memory block BLKa is improved, however, the size of the memory block BLKa increases. As less memory cells are provided, the size of the memory block BLKa may be reduced, however, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed. When the erase operation is performed after the program operation is performed, the dummy memory cells may have the required threshold voltage by controlling a voltage applied to dummy word lines connected to the respective dummy memory cells.

Figure 5:
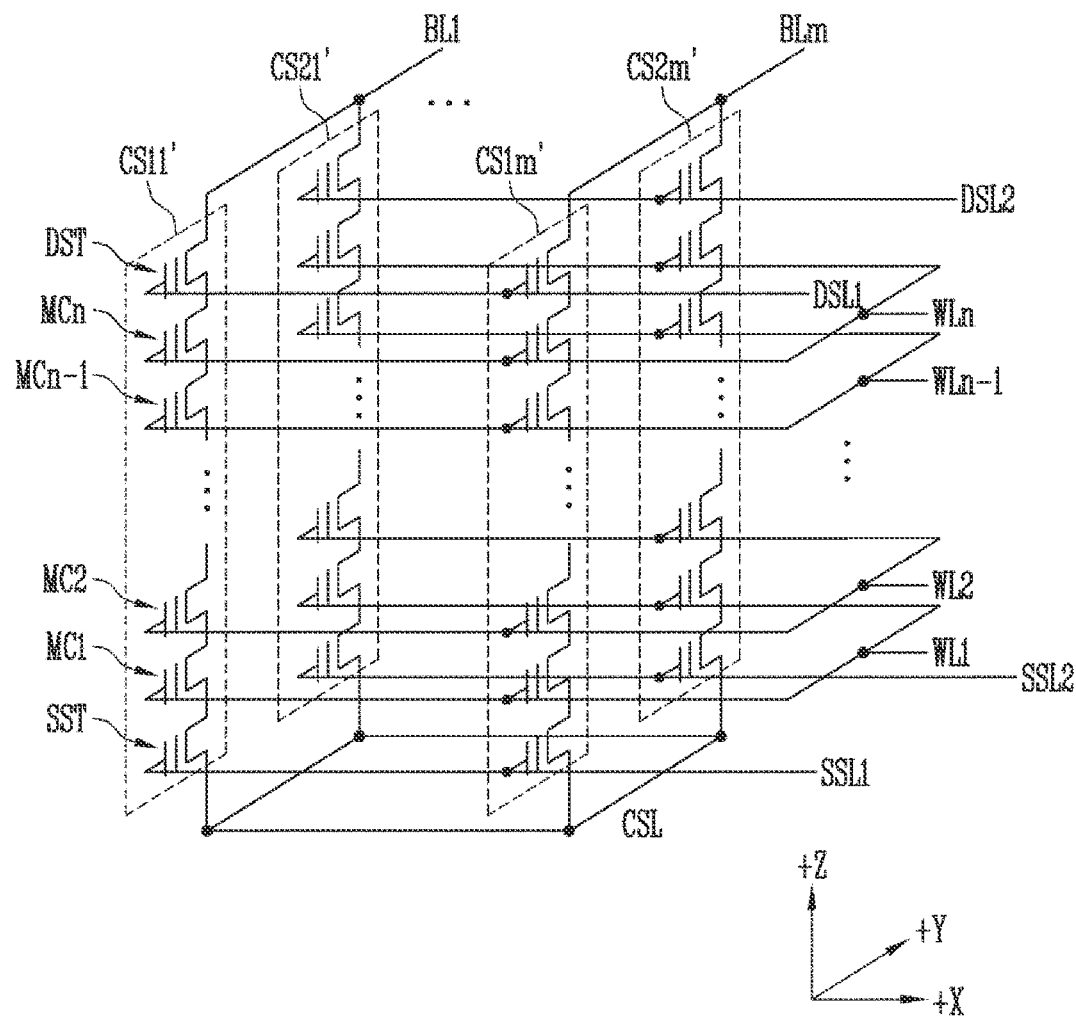
FIG. 5 is a circuit diagram illustrating another embodiment of any one memory block BLKb among the memory blocks BLK1 to BLKz of FIG. 3.

FIG. 5 is a circuit diagram illustrating another embodiment of any one memory block BLKb among the memory blocks BLK1 to BLKz of FIG. 3.

Referring to FIG. 5, the memory block BLKb includes a plurality of cell strings CS11' to CS1m' and CS21' to CS2m'. Each of the plurality of cell strings CS11' to CS1m' and CS21' to CS2m' extends along a +Z direction. Each of the plurality of cell strings CS11' to CS1m' and CS21' to CS2m' includes at least one source select transistor SST, first to n-th memory cells MC1 to MCn, and at least one drain select transistor DST stacked on a substrate (not shown) under the memory block BLK1'.

The source select transistor SST of each cell string is connected between a common source line CSL and memory cells MC1 to MCn. The source select transistors of the cell strings arranged in the same row are connected to the same source select line. The source select transistors of the cell strings CS11' to CS1m' arranged in a first row are connected to a first source select line SSL1. The source select transistors of the cell strings CS21' to CS2m' arranged in a second row are connected to a second source select line SSL2. As another embodiment, the source select transistors of the cell strings CS11' to CS1m' and CS21' to CS2m' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1m' of a first row are connected to a first drain select line DSL1. The drain select transistors of the cell strings CS21' to CS2m' of a second row are connected to a second drain select line DSL2.

As a result, the memory block BLKb of FIG. 5 has an equivalent circuit similar to that of the memory block BLKa of FIG. 4 except that the pipe transistor PT is excluded from each cell string.

As another embodiment, even bit lines and odd bit lines may be provided instead of the first to m-th bit lines BL1 to BLm. In addition, even-numbered cell strings among the cell strings CS11' to CS1m' or CS21' to CS2m' arranged in the row direction may be connected to even bit lines, and odd-numbered cell strings among the cell strings CS11' to CS1m' or CS21' to CS2m' arranged in the row direction may be connected to odd bit lines, respectively.

In addition, in order to reduce the electric field between the source select transistor SST and the memory cells MC1 to MCn, at least one of the first to n-th memory cells MC1 to MCn may be used as the dummy memory cell.

Figure 6:
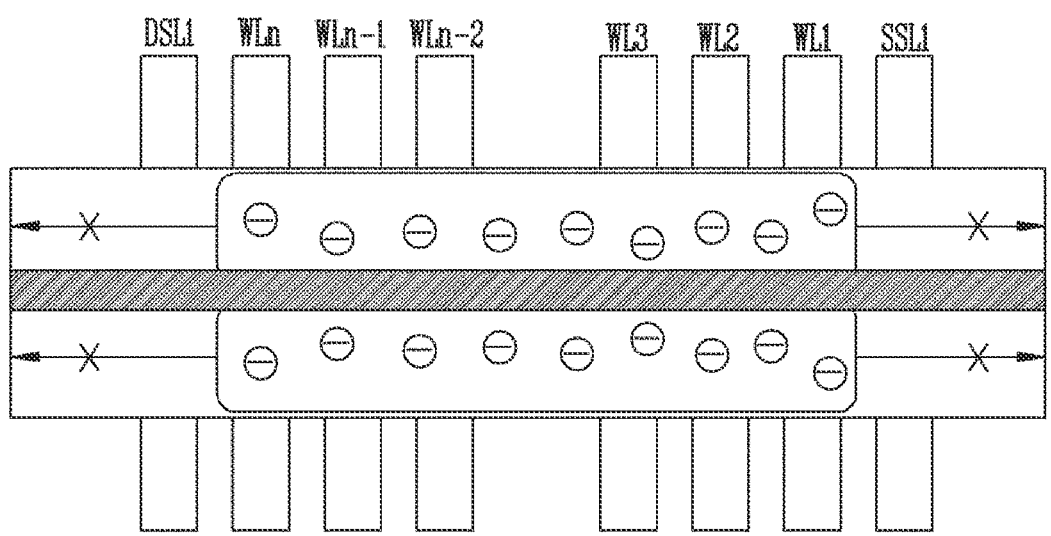
FIG. 6 is a diagram illustrating channel negative boosting.

FIG. 6 is a diagram illustrating channel negative boosting.

Referring to FIGS. 4 and 6, FIG. 6 shows the first drain select line DSL1, the first source select line SSL1, and the first to n-th word lines WL1 to WLn between the first drain select line DSL1 and the first source select line SSL1 of FIG. 4. The contents described with reference to FIG. 6 may be applied to the memory block structure of FIG. 5 as well as the memory block structure of FIG. 4.

In an embodiment, a turn-off voltage may be applied to the first drain select line DSL1 and the first source select line SSL1 for a reason such as an end of the sensing operation of the memory device 100 of FIG. 2. That is, a voltage for turning off transistors connected to the first drain select line DSL1 and the first source select line SSL1 may be applied to the first drain select line DSL1 and the first source select line SSL1.

In an embodiment, when the turn-off voltage is applied to the first drain select line DSL1 and the first source select line SSL1, a channel of the first to n-th word lines WL1 to WLn may be floated. That is, since the turn-off voltage is applied to the first drain select line DSL1 and the first source select line SSL1, the memory cells connected to the first to n-th word lines WL1 to WLn and the transistors connected to the first drain select line DSL1 and the first source select line SSL1 may be separated.

When the channel of the first to n-th word lines WL1 to WLn is floated, charges in the channel of the first to n-th word lines WL1 to WLn may be isolated, and a channel potential may become a negative value. That is, a channel negative boosting phenomenon may occur. This is because a gate electrode of the memory cells is formed of polysilicon in a three-dimensional memory block structure.

In the present disclosure, in order to prevent, or in some embodiments mitigate, such a channel negative boosting phenomenon, a method of controlling a voltage applied to the word line, the drain select line, and the source select line is presented.

Figure 7:
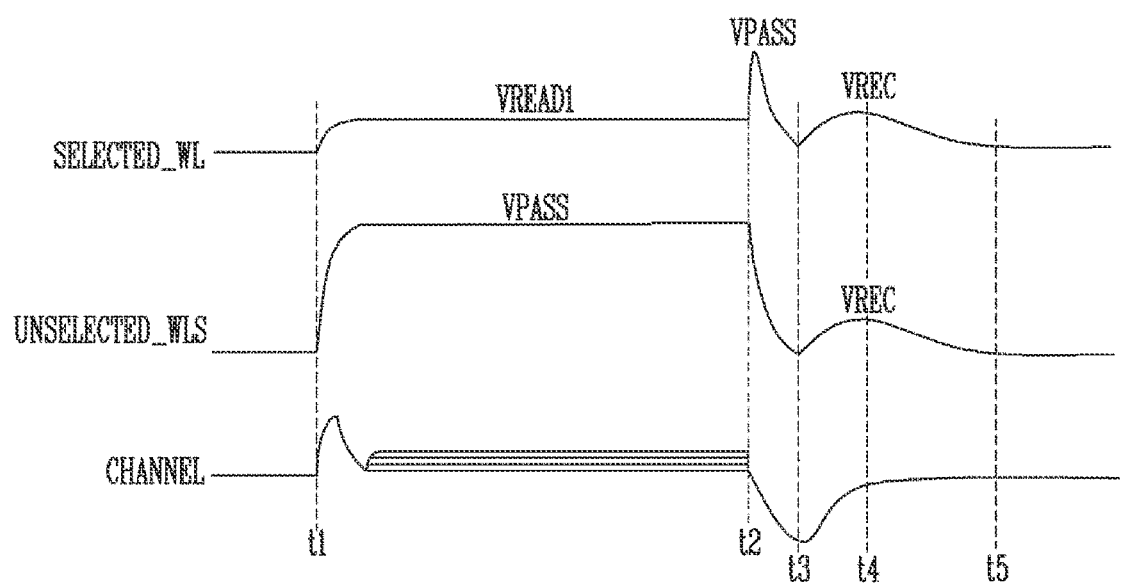
FIG. 7 is a diagram illustrating a voltage applied to a word line and a channel potential during a sensing operation.

FIG. 7 is a diagram illustrating a voltage applied to a word line and a channel potential during a sensing operation.

Referring to FIG. 7, FIG. 7 shows a change of a voltage applied to a selected word line SELECTED_WL, a voltage applied to unselected word lines UNSELECTED_WLS, and a channel CHANNEL potential, during a sensing operation on a selected word line SELECTED_WL among the plurality of word lines connected to the memory block.

In FIG. 7, it is assumed that the sensing operation is started at t1. The sensing operation may be an operation of sensing the selected word line SELECTED_WL among the plurality of word lines connected to the memory block. The sensing operation may be the read operation or the verify operation.

In an embodiment, the control logic 130 of FIG. 2 may control the peripheral circuit 120 of FIG. 2 to perform the sensing operation by applying the sensing voltage to the selected word line SELECTED_WL and applying a pass voltage VPASS to the unselected word lines UNSELECTED_WLS.

In an embodiment, the voltage applied to the selected word line SELECTED_WL at t1 may be a first read voltage VREAD1. The first read voltage VREAD1 may be a voltage for distinguishing between an erase state and a program state of selected memory cells connected to the selected word line SELECTED_WL. A read operation performed with the first read voltage VREAD1 may be a first read operation.

In another embodiment, the voltage applied to the selected word line SELECTED_WL may be a first verify voltage. The first verify voltage may be a voltage for determining whether the selected memory cells connected to the selected word line SELECTED_WL are programmed to a target program state. The first read voltage VREAD1 and the first verify voltage may be sensing voltages.

At t1, the voltage applied to the unselected word lines UNSELECTED_WLS may be the pass voltage VPASS. The pass voltage VPASS may be a voltage for turning on memory cells connected to word lines except for the selected word line SELECTED_WL. The voltage applied to the unselected word lines UNSELECTED_WLS may be maintained as the pass voltage VPASS until sensing is completed.

At t1, after the sensing operation is started, data programmed to the memory cells connected to the selected word line SELECTED_WL may be sensed through the bit lines connected to the memory cells, respectively.

At t1 to t2, the data sensed through the bit lines may be stored in the page buffer group 123 of FIG. 2. The sensed data may be read data or verify data. The read data may be data read through the bit lines to read the data programmed to the memory cells. The verify data may be data read through the bit lines to verify whether a program for the memory cells is completed. The program state of the memory cells may be determined based on the sensed data.

After t2, the sensing operation may be ended and the equalizing operation may be performed. The equalizing operation may be an operation of setting identically potentials of the selected word line SELECTED_WL and the unselected word lines UNSELECTED_WLS in order to discharge the selected word line SELECTED_WL and the unselected word lines UNSELECTED_WLS.

In an embodiment, when discharging the plurality of word lines, the voltages applied to the selected word line SELECTED_WL and the unselected word lines UNSELECTED_WLS are different during the sensing operation, and thus a timing at which the discharge operation is completed may vary. Therefore, after the sensing operation, the pass voltage VPASS may be applied to the selected word line SELECTED_WL, and thus the potentials of the selected word line SELECTED_WL and the unselected word lines UNSELECTED_WLS may be identically set.

In an embodiment, after the pass voltage VPASS is applied to the selected word line SELECTED_WL, at t2 to t3, the selected word line SELECTED_WL and the unselected word lines UNSELECTED_WLS may be simultaneously discharged. That is, after the potentials of the selected word line SELECTED_WL and the unselected word lines UNSELECTED_WLS are identically set to a pass voltage VPASS level, the selected word line SELECTED_WL and the unselected word lines UNSELECTED_WLS may be simultaneously discharged.

In an embodiment, the channel CHANNEL potential may be a channel potential of the plurality of memory cells connected to any one of the plurality of cell strings connected to the bit lines. Before the sensing operation is performed, the channel CHANNEL potential may be 0V.

At t1, the channel CHANNEL potential momentarily may increase, and then may become 0V again. For example, when the sensing voltage and the pass voltage VPASS are respectively applied to the selected word line SELECTED_WL and the unselected word lines UNSELECTED_WLS, channel coupling between word lines may occur. When the channel coupling between word lines occurs, the channel CHANNEL potential may increase. The increased channel CHANNEL potential may become 0V again after a predetermined time has elapsed.

The channel CHANNEL potential changed to 0V again may have various potentials according to the program state of the memory cells. That is, since the plurality of memory cells connected to the cell string may have various program states, a current flowing through the plurality of memory cells may be various according to the voltage applied to the word line. As a result, the channel CHANNEL potential may have various values according to the program state of the plurality of memory cells connected to the cell string.

After the sensing operation is ended (after t2), as the selected word line SELECTED_WL and the unselected word lines UNSELECTED_WLS are simultaneously discharged at t2 to t3, the channel CHANNEL potential may have a negative value. At this time, a phenomenon in which the channel CHANNEL potential becomes a negative value is referred to as the channel negative boosting.

In an embodiment, as the channel negative boosting occurs, a recovery operation for the channel negative boosting may be performed.

That is, at t3 to t4, the channel CHANNEL potential may be increased by applying a recovery voltage VREC to the selected word line SELECTED_WL and the unselected word lines UNSELECTED_WLS.

After the channel potential is increased, the selected word line SELECTED_WL and the unselected word lines UNSELECTED_WLS may be discharged, and thus the selected word line SELECTED_WL, the unselected word lines UNSELECTED_WLS, and the channel CHANNEL potential may become 0V.

During the sensing operation, as the channel negative boosting occurs, a recovery operation is performed therefor, and thus a time consumed for the sensing operation may be lengthened. In addition, during the recovery operation for the channel negative boosting, a read disturb phenomenon may occur. That is, as the recovery voltage VREC is applied to the selected word line SELECTED_WL and the unselected word lines UNSELECTED_WLS and then the selected word line SELECTED_WL and the unselected word lines UNSELECTED_WLS discharged, a threshold voltage distribution of the memory cells of the erase state may increase.

Therefore, in the present disclosure, a method of preventing, or in some embodiments mitigating, the channel negative boosting is presented.

Figure 8:
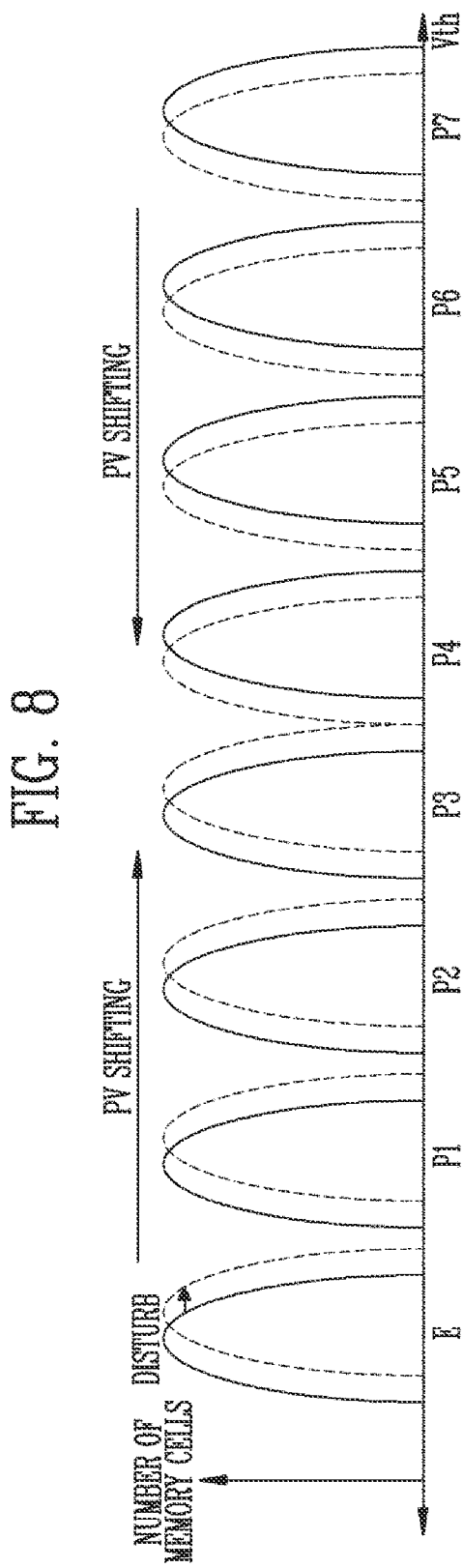
FIG. 8 is a diagram illustrating movement and disturbance of a threshold voltage distribution according to channel negative boosting.

FIG. 8 is a diagram illustrating movement and disturbance of a threshold voltage distribution according to channel negative boosting.

Referring to FIGS. 7 and 8, FIG. 8 shows an effect of the channel negative boosting described with reference to FIG. 7.

In FIG. 8, it is assumed that the memory cells have any one of an erase state E or first to seventh program states P1 to P7. That is, FIG. 8 shows a change of the threshold voltage distribution when the memory cells are programmed in a triple level cell (TLC) method.

FIG. 8 may also be applied to a case where the memory cells are programmed in a single level cell (SLC) method, a multi-level cell (MLC) method, or a quadruple level cell (TLC) method.

In an embodiment, hot carrier injection (HCI) may occur by the channel negative boosting. As the HCI occurs, shifting PV SHIFTING and a disturb DISTURB phenomenon of the threshold voltage distribution may occur.

Referring to FIGS. 4 and 5, as the drain select transistors and the source select transistors of FIGS. 4 and 5 are turned off, the charges in the channel are isolated, and the isolated charges are moved to the memory cells. Therefore, a threshold voltage of memory cells of a low program state may be increased. For example, a threshold voltage of the memory cells of the first to third program states P1 to P3 may be increased (PV SHIFTING).

In addition, as the charges in the channel are isolated, the charges trapped in the memory cells are moved to the channel, and thus a threshold voltage of memory cells of a high program state may be decreased. For example, a threshold voltage of the memory cells of the fourth to seventh program states P4 to P7 may be decreased (PV SHIFTING).

Furthermore, coupling of the word lines and the channel may occur due to the channel negative boosting. Therefore, when the recovery voltage is applied to the word lines during the recovery operation performed after the channel negative boosting, disturb DISTURB may occur. As the disturb DISTURB occurs, a threshold voltage of the memory cells of the erase state E may increase.

As a result, due to the channel negative boosting and the recovery operation therefor, the threshold voltage distribution of the memory cells is changed, and reliability of the data programmed to the memory cells may decrease as the threshold voltage distribution is changed.

Figure 9:
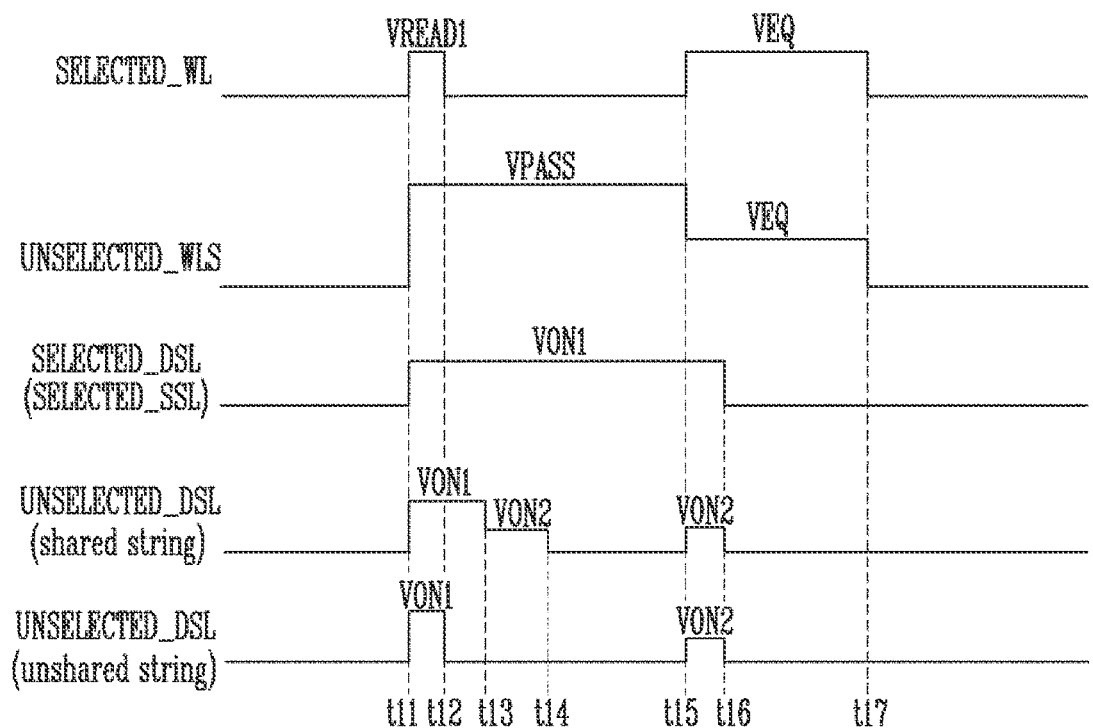
FIG. 9 is a diagram illustrating a voltage applied to each line during a sensing operation according to the present disclosure.

FIG. 9 is a diagram illustrating a voltage applied to each line during a sensing operation according to the present disclosure.

Referring to FIG. 9, FIG. 9 shows a voltage applied to each line before and after the equalizing operation to prevent, or in some embodiments mitigate, the channel negative boosting during the sensing operation. The equalizing operation may be an operation performed when the memory device 100 of FIG. 2 performs the sensing operation, and may be an operation of identically setting the potentials of the selected word line SELECTED_WL and the unselected word lines UNSELECTED_WLS after sensing. Here, the sensing operation may be the read operation or the verify operation.

In FIG. 9, it is assumed that the sensing operation is the read operation.

In an embodiment, at t1l, the read operation may be started. Therefore, at t1l, the word line controller 150 of FIG. 2 may control the memory device 100 of FIG. 2 so that the first read voltage VREAD1 is applied to the selected word line SELECTED_WL, the pass voltage VPASS is applied to the unselected word lines UNSELECTED_WLS, respectively.

Here, the first read voltage VREAD1 may be a voltage for distinguishing the erase state and the program state of the selected memory cells connected to the selected word line SELECTED_WL. The read operation performed with the first read voltage VREAD1 may be the first read operation. In addition, the pass voltage VPASS may be a voltage for turning on the memory cells connected to the word lines except for the selected word line SELECTED_WL.

In an embodiment, at t11 to t12, the read operation may be performed by applying the first read voltage VREAD1 to the selected word line SELECTED_WL. At this time, the word line controller 150 of FIG. 2 may control the memory device 100 of FIG. 2 so that the voltage applied to the unselected word lines UNSELECTED_WLS is maintained as the pass voltage VPASS until the sensing is completed.

In an embodiment, at t11, the drain select line controller 160 of FIG. 2 may control the memory device 100 of FIG. 2 to apply the voltage to the drain select lines by dividing the drain select lines into selected drain select lines SELECTED_DSL and unselected drain select lines UNSELECTED_DSL.

The unselected drain select line UNSELECTED_DSL may be divided according to whether the unselected drain select line UNSELECTED_DSL shares the cell string with the selected drain select line SELECTED_DSL. When the unselected drain select line UNSELECTED_DSL shares the cell string with the selected drain select line SELECTED_DSL (shared string), since the channel negative boosting may occur together in the cell string due to turn-on or turn-off of a transistor connected to the selected drain select line SELECTED_DSL, division is required.

Furthermore, voltages of different levels may be applied to the unselected drain select line UNSELECTED_DSL sharing the cell string with the selected drain select line SELECTED_DSL (shared string), and the unselected drain select line UNSELECTED_DSL which does not share the cell string with the selected drain select line SELECTED_DSL (unshared string).

The selected drain select line SELECTED_DSL and the unselected drain select line UNSELECTED_DSL sharing the cell string are described below through FIGS. 10 to 12.

In an embodiment, the drain select line controller 160 FIG. 2 may control the memory device 100 of FIG. 2 to apply a first turn-on voltage VON1 for turning on the drain select transistors to the selected drain select line SELECTED_DSL. In addition, the source select line controller 170 of FIG. 2 may control the memory device 100 of FIG. 2 to apply the first turn-on voltage VON1 for turning on the source select transistors to the selected source select line SELECTED_SSL.

In an embodiment, in a case of the unselected drain select line UNSELECTED_DSL sharing the cell string with the selected drain select line SELECTED_DSL, the first turn-on voltage VON1 may be applied to the unselected drain select line UNSELECTED_DSL at t11 to t13, and a second turn-on voltage VON2 may be applied to the unselected drain select line UNSELECTED_DSL at t13 to t14. The second turn-on voltage VON2 may be a voltage lower than the first turn-on voltage VON1, and may be a voltage for turning on the drain select transistors, similar to the first turn-on voltage VON1.

That is, the voltage applied to the unselected drain select line UNSELECTED_DSL sharing the cell string with the selected drain select line SELECTED_DSL may be sequentially decreased from t11 to t14. By sequentially decreasing the voltage applied to the unselected drain select line UNSELECTED_DSL, charges that are excessively present in the channel may be moved to the unselected drain select line UNSELECTED_DSL.

However, in a case of the unselected drain select line UNSELECTED_DSL which does not share the cell string (unshared string) with the selected drain select line SELECTED_DSL, since the channel charge is not required to be moved, the first turn-on voltage VON1 may be applied only at t11 to t12.

In an embodiment, after the sensing operation is performed at t11 to t15, the equalizing operation may be started at t15.

During the equalizing operation, the word line controller 150 of FIG. 2 may increase a potential of the selected word line SELECTED_WL from 0V to an equalizing voltage VEQ, may decrease a potential of the unselected word lines UNSELECTED_WLS from the pass voltage VPASS to the equalizing voltage VEQ.

That is, differently from the conventional equalizing operation in which only the potential of the selected word line SELECTED_WL is increased from 0V to the pass voltage VPASS, in the present disclosure, the potential of the unselected word lines UNSELECTED_WLS may be decreased while increasing the potential of the selected word line SELECTED_WL.

In an embodiment, each of the drain select line controller 160 of FIG. 2 and the source select line controller 170 of FIG. 2 may control the memory device 100 to apply a ground voltage 0V to the selected drain select line SELECTED_DSL and the selected source select line SELECTED_SSL at t16.

That is, during the sensing operation, after the first turn-on voltage VON1 applied to the selected drain select line SELECTED_DSL and the selected source select line SELECTED_SSL is maintained only for a preset time t15 to t16 after the equalizing operation is started, the ground voltage 0V may be applied to the selected drain select line SELECTED_DSL and the selected source select line SELECTED_SSL.

Therefore, during the sensing operation, the charges in the floated channel may be discharged by maintaining the first turn-on voltage VON1 applied to the selected drain select line SELECTED_DSL and the selected source select line SELECTED_SSL for a predetermined time after the equalizing operation is started.

In addition, in order to discharge the charges in the floated channel at t15 to t16, the drain select line controller 160 of FIG. 2 may control the memory device 100 to apply the second turn-on voltage VON2 to the unselected drain select line UNSELECTED_DSL.

At this time, in the case of the unselected drain select line UNSELECTED_DSL which do not share the cell string with the selected drain select line SELECTED_DSL (unshared string), the unselected drain select line UNSELECTED_DSL which do not share the cell string with the selected drain select line SELECTED_DSL is not connected to the bit line on which the sensing operation is performed, but the unselected drain select line UNSELECTED_DSL which do not share the cell string with the selected drain select line SELECTED_DSL may be affected by the channel negative boosting according to the program state of the memory cells in the same memory block or of an adjacent cell string, the second turn-on voltage VON2 may be applied to the unselected drain select line UNSELECTED_DSL. That is, since a down coupling phenomenon (DCP) may occur, the second turn-on voltage VON2 may be applied to the unselected drain select line UNSELECTED_DSL at t15 to t16, and thus a channel charge may be moved to the unselected drain select line UNSELECTED_DSL.

In an embodiment, at t17, the word lines may be discharged. By controlling the voltage applied to the drain select lines and the source select lines at t15 to t16, when the word lines are discharged at t17, the channel negative boosting may be prevented, or in some embodiments mitigated.

Figure 10:
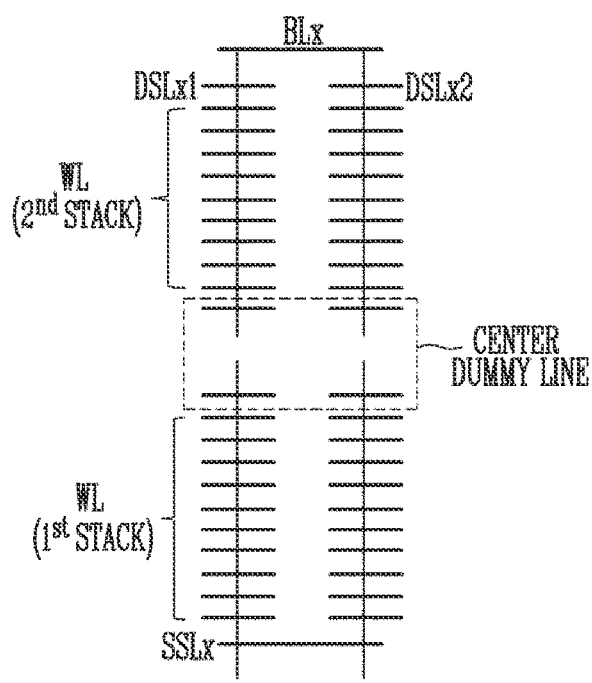
FIG. 10 is a diagram illustrating a structure of a memory block having two cell strings.

FIG. 10 is a diagram illustrating a structure of a memory block having two cell strings.

Referring to FIGS. 2 and 10, FIG. 10 shows lines connected to one of the plurality of memory blocks BLK1 to BLKz of FIG. 2.

In FIG. 10, the memory block may have a structure in which two cell strings are connected.

For example, among the two cell strings, a first cell string may be a cell string connecting an x1-th drain select line DSLx1 and an x-th source select line SSLx, and the second cell string may be a cell string connecting an x–2-th drain select line DSLx2 and an x-th source select line SSLx. The x1-th drain select line DSLx1 and the x2-th drain select line DSLx2 may be connected to the x-th bit line BLx.

The first cell string and the second cell string may be connected to word lines included in two stacks.

For example, the first cell string may be connected to a first stack 1$^{st}$ STACK including word lines connected between the x-th source select line SSLx and a center dummy line CENTER DUMMY LINE and a second stack 2$^{nd}$ STACK including word lines connected between the x1-th drain select line DSLx1 and the center dummy line CENTER DUMMY LINE.

In addition, for example, the second cell string may be connected to the first stack 1$^{st}$ STACK including the word lines connected between the x-th source select line SSLx and the center dummy line CENTER DUMMY LINE and the second stack 2$^{nd}$ STACK including the word lines connected between the x2-th drain select line DSLx2 and the center dummy line CENTER DUMMY LINE.

In an embodiment, when the x1-th drain select line DSLx1 is the selected drain select line, since the x1-th drain select line DSLx1 and the x2-th drain select line DSLx2 are connected to each string through the x-th source select line SSLx which is one source select line, the x2-th drain select line DSLx2 may be the unselected drain select line and may be a line sharing the cell string with the x1-th drain select line DSLx1.

Therefore, in a case of a memory block having two or more stack structures, a channel length may be increased. However, even though the voltage of each line is controlled as described with reference to FIG. 9 to reduce the channel negative boosting as the channel length is increased, a width at which the channel potential increases may be small.

In an embodiment, in order to increase an increase width of the channel potential, a sudden increase or decrease of a potential of the center dummy line CENTER DUMMY LINE is required to be prevented, or in some embodiments mitigated. That is, when dummy cells connected to the center dummy line CENTER DUMMY LINE are programmed, a voltage applied to the center dummy line CENTER DUMMY LINE is required to be controlled because a threshold voltages of adjacent memory cells may be affected.

Figure 11:
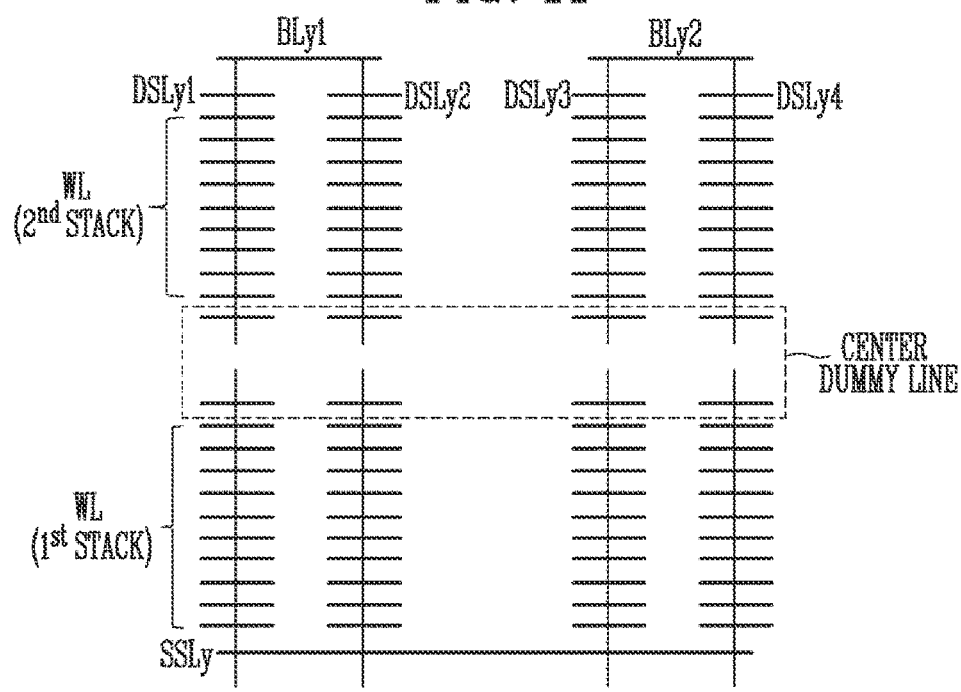
FIG. 11 is a diagram illustrating a structure of a memory block having four cell strings.

FIG. 11 is a diagram illustrating a structure of a memory block having four cell strings.

Referring to FIGS. 2 and 11, FIG. 11 shows lines connected to one of the plurality of memory blocks BLK1 to BLKz of FIG. 2.

Referring to FIGS. 10 and 11, differently from FIG. 10, the memory block of FIG. 11 may have a structure in which four cell strings are connected.

For example, among the four cell strings, a first cell string may be a cell string connecting a y1-th drain select line DSLy1 and a y-th source select line SSLy, a second cell string may be a cell string connecting a y2-th drain select line DSLy2 and the y-th source select line SSLy, a third cell string may be a cell string connecting a y3-th drain select line DSLy3 and the y-th source select line SSLy, and the fourth cell string may be a cell string connecting a y4-th drain select line DSLy4 and the y-th source select line SSLy.

The y1-th drain select line DSLy1 and the y2-th drain select line DSLy2 may be connected to a y1-th bit line BLy1, and the y3-th drain select line DSLy3 and the y4-th drain select line DSLy4 may be connected to a y2-th bit line BLy2.

Similarly to that described with reference to FIG. 10, each of the first to fourth cell strings may be connected to word lines included in two stacks.

For example, the first cell string may be connected to a first stack 1$^{st}$ STACK including word lines connected between the y-th source select line SSLy and the center dummy line CENTER DUMMY LINE and a second stack 2$^{nd}$ STACK including word lines connected between the y1-th drain select line DSLy1 and the center dummy line CENTER DUMMY LINE.

The second cell string may be connected to the first stack 1$^{st}$ STACK including the word lines connected between the y-th source select line SSLy and the center dummy line CENTER DUMMY LINE and a second stack 2$^{nd}$ STACK including word lines connected between the y2-th drain select line DSLy2 and the center dummy line CENTER DUMMY LINE.

The third cell string may be connected to the first stack 1$^{st}$ STACK including the word lines connected between the y-th source select line SSLy and the center dummy line CENTER DUMMY LINE and a second stack $2^{nd}$ STACK including word lines connected between the y3-th drain select line DSLy3 and the center dummy line CENTER DUMMY LINE.

The fourth cell string may be connected to the first stack $1^{st}$ STACK including the word lines connected between the y-th source select line SSLy and the center dummy line CENTER DUMMY LINE and a second stack $2^{nd}$ STACK including word lines connected between the y4-th drain select line DSLy4 and the center dummy line CENTER DUMMY LINE.

In an embodiment, when the y1-th drain select line DSLy1 is the selected drain select line, since the y1-th to y4-th drain select lines DSLy1 to DSLy4 are connected to each string through the y-th source select line SSLy which is one source select line, each of the y2-th to y4-th drain select lines DSLy2 to DSLy4 may be the unselected drain select line and may be a line sharing the cell string with the y1-th drain select line DSLy1.

In addition, as described with reference to FIG. 10, in the case of the memory block having two or more stack structures, since the channel length is increased, in order to increase the increase width of the channel potential, the sudden increase or decrease of the potential of the center dummy line CENTER DUMMY LINE is required to be mitigated or, in some embodiments, prevented. Therefore, the voltage applied to the center dummy line CENTER DUMMY LINE is required to be controlled.

Figure 12:
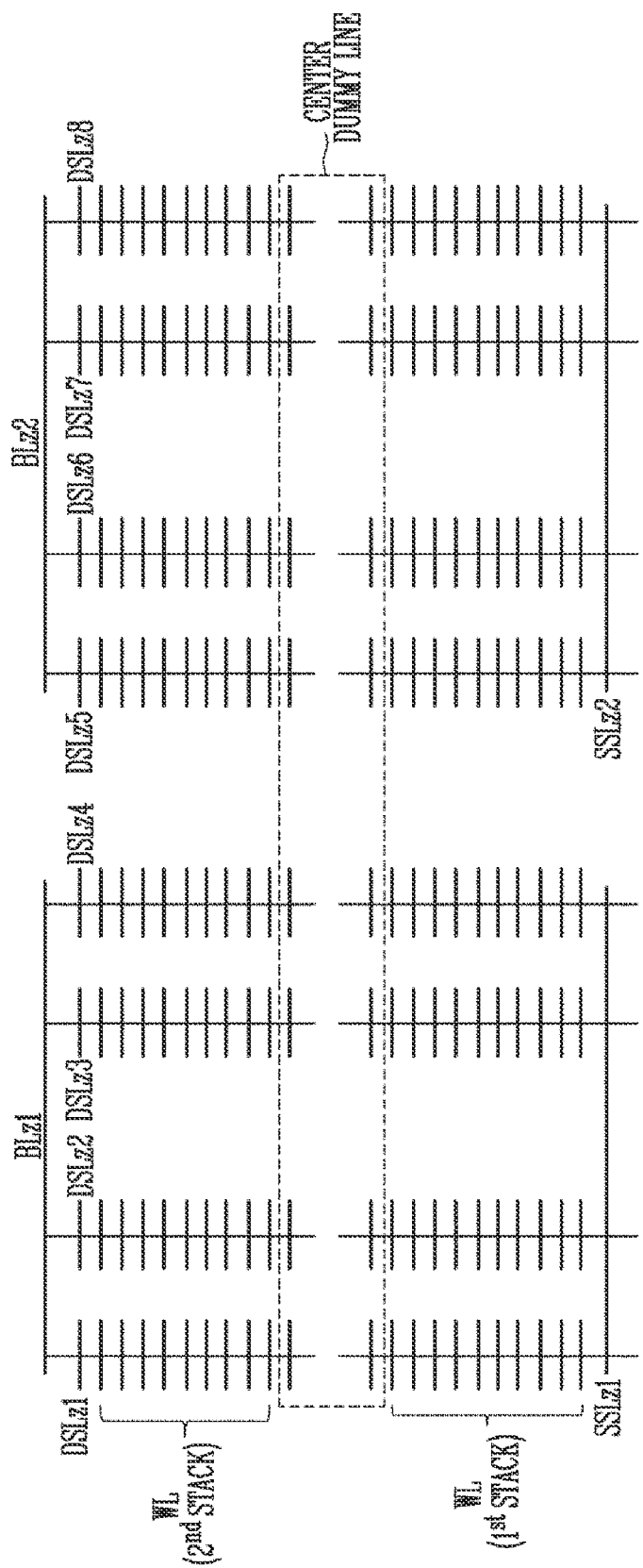
FIG. 12 is a diagram illustrating a structure of a memory block having eight cell strings.

FIG. 12 is a diagram illustrating a structure of a memory block having eight cell strings.

Referring to FIGS. 2 and 12, FIG. 12 shows lines connected to one of the plurality of memory blocks BLK1 to BLKz of FIG. 2.

Referring to FIGS. 10 and 12, apart from FIG. 10, the memory block of FIG. 12 may have a structure in which eight cell strings are connected.

For example, a first cell string of the eight cell strings may be a cell string connecting a z1-th drain select line DSLz1 and a z1-th source select line SSLz1, a second cell string may be a cell string connecting a z2-th drain select line DSLz2 and the z1-th source select line SSLz1, a third cell string may be a cell string connecting a z3-th drain select line DSLz3 and the z1-th source select line SSLz1, and a fourth cell string may be a cell string connecting a z4-th drain select line DSLz4 and the z1-th source select line SSLz1.

In addition, a fifth cell string may be a cell string connecting a z5-th drain select line DSLz5 and a z2-th source select line SSLz2, the sixth cell string may be a cell string connecting a z6-th drain select line DSLz6 and the z2-th source select line SSLz2, a seventh cell string may be a cell string connecting a z7-th drain select line DSLz7 and the z2-th source select line SSLz2, and the eighth cell string may be a cell string connecting a z8-th drain select line DSLz8 and the z2-th source select line SSLz2.

The z1-th to z4-th drain select lines DSLz1 to DSLz4 may be connected to a z1-th bit line BLz1, and the z5-th to z8-th drain select lines DSLz5 to DSLz8 may be connected to a z2-th bit line BLz2.

Similarly to that described with reference to FIG. 10, each of the first to eighth cell strings may be connected to word lines included in two stacks.

For example, the first cell string may be connected to a first stack $1^{st}$ STACK including word lines connected between the z1-th source select line SSLz1 and the center dummy line CENTER DUMMY LINE and a second stack $2^{nd}$ STACK including word lines connected between the z1-th drain select line DSLz1 and the center dummy line CENTER DUMMY LINE.

The second cell string may be connected to the first stack $1^{st}$ STACK including the word lines connected between the z1-th source select line SSLz1 and the center dummy line CENTER DUMMY LINE and a second stack $2^{nd}$ STACK including word lines connected between the z2-th drain select line DSLz2 and the center dummy line CENTER DUMMY LINE.

The third cell string may be connected to the first stack $1^{st}$ STACK including the word lines connected between the z1-th source select line SSLz1 and the center dummy line CENTER DUMMY LINE and a second stack $2^{nd}$ STACK including word lines connected between the z3-th drain select line DSLz3 and the center dummy line CENTER DUMMY LINE.

The fourth cell string may be connected to the first stack $1^{st}$ STACK including the word lines connected between the z1-th source select line SSLz1 and the center dummy line CENTER DUMMY LINE and a second stack $2^{nd}$ STACK including word lines connected between the z4-th drain select line DSLz4 and the center dummy line CENTER DUMMY LINE.

For example, the fifth cell string may be connected to a first stack $1^{st}$ STACK including word lines connected between the z2-th source select line SSLz2 and the center dummy line CENTER DUMMY LINE and a second stack $2^{nd}$ STACK including word lines connected between the z5-th drain select line DSLz5 and the center dummy line CENTER DUMMY LINE.

The sixth cell string may be connected to the first stack $1^{st}$ STACK including the word lines connected between the z2-th source select line SSLz2 and the center dummy line CENTER DUMMY LINE and a second stack $2^{nd}$ STACK including word lines connected between the z6-th drain select line DSLz6 and the center dummy line CENTER DUMMY LINE.

The seventh cell string may be connected to the first stack $1^{st}$ STACK including the word lines connected between the z2-th source select line SSLz2 and the center dummy line CENTER DUMMY LINE and a second stack $2^{nd}$ STACK including word lines connected between the z7-th drain select line DSLz7 and the center dummy line CENTER DUMMY LINE.

The eighth cell string may be connected to the first stack $1^{st}$ STACK including the word lines connected between the z2-th source select line SSLz2 and the center dummy line CENTER DUMMY LINE and a second stack $2^{nd}$ STACK including word lines connected between the z8-th drain select line DSLz8 and the center dummy line CENTER DUMMY LINE.

In an embodiment, when the z1-th drain select line DSLz1 is the selected drain select line, since the z1-th to z4-th drain select lines DSLz1 to DSLz4 are connected to each string through the z1-th source select line SSLz1 which is one source select line, each of the z2-th to z4-th drain select lines DSLz2 to DSLz4 may be the unselected drain select line and may be a line sharing the cell string with the z1-th drain select line DSLz1.

However, since the z5-th to z8-th drain select lines DSLz5 to DSLz8 are connected to each string through the z2-th source select line SSLz2 other than the z1-th source select line SSLz1, each of the z5-th to z8-th drain select lines DSLz5 to DSLz8 may be the unselected drain select line and may be a line which does not share the cell string with the z1-th drain select line DSLz1.

In addition, as described with reference to FIG. 10, in the case of the memory block having two or more stack structures, since the channel length is increased, in order to increase the increase width of the channel potential, the sudden increase or decrease of the potential of the center dummy line CENTER DUMMY LINE is required to be prevented, or in some embodiments mitigated. Therefore, the voltage applied to the center dummy line CENTER DUMMY LINE is required to be controlled.

Figure 13:
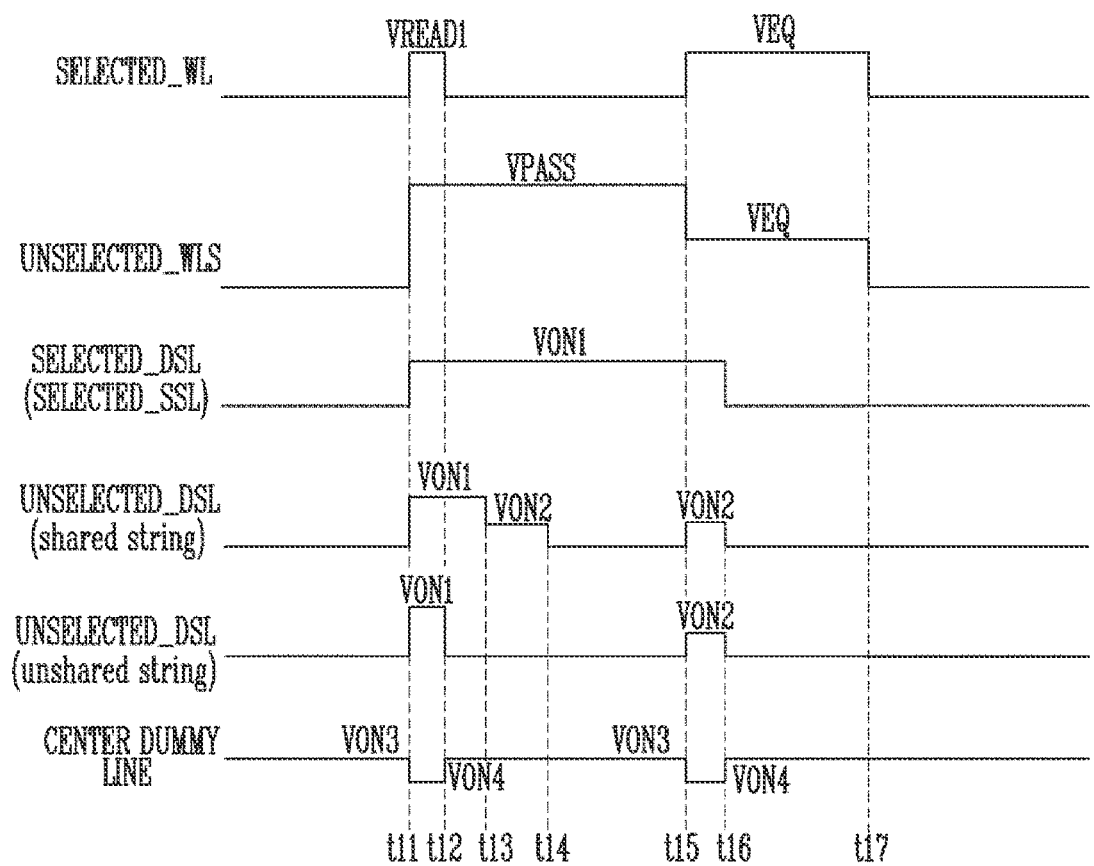
FIG. 13 is a diagram illustrating a voltage additionally applied to a dummy line during the sensing operation of FIG. 9.

FIG. 13 is a diagram illustrating a voltage additionally applied to a dummy line during the sensing operation of FIG. 9.

Referring to FIGS. 9 and 13, FIG. 13 shows a method of additionally controlling the center dummy line CENTER DUMMY LINE as well as the voltage control of FIG. 9 in order to prevent, or in some embodiments mitigate, the channel negative boosting during the sensing operation.

In FIG. 13, a descriptions repetitive to that of FIG. 9 is omitted.

Referring to FIGS. 10 and 11, the center dummy line CENTER DUMMY LINE may be a line positioned between the word lines of the first stack $1^{st}$ STACK and the word lines of the second stack $2^{nd}$ STACK, and may be a line for distinguishing between the word lines of the first stack $1^{st}$ STACK and the word lines of the second stack $2^{nd}$ STACK. The number of center dummy lines CENTER DUMMY LINE may be plural. Furthermore, a dummy program operation may be performed on dummy memory cells connected to the center dummy line CENTER DUMMY LINE.

In an embodiment, the dummy line controller 180 of FIG. 2 may control the memory device 100 of FIG. 2 so that the potential of the center dummy line CENTER DUMMY LINE is decreased when the voltage is applied to the unselected drain select line UNSELECTED_DSL which does not share the cell string with the selected drain select line SELECTED_DSL (unshared string).

That is, the dummy line controller 180 of FIG. 2 may control the memory device 100 of FIG. 2 so that the voltage applied to the center dummy line CENTER DUMMY LINE is interconnected with the voltage applied to the unselected drain select line UNSELECTED_DSL which does not share the cell string with the selected drain select line SELECTED_DSL (unshared string). This is for suppressing a hot carrier injection (HCI) since when the memory block has a stack structure, the channel potential is changed due to a gap between the stacks, and as the channel potential is changed, the HCI into the dummy cells connected to a stack connection, that is, the center dummy line CENTER DUMMY LINE may occur. In addition, this is for suppressing a discharge efficiency decrease of the drain select lines due to a channel length increase.

In an embodiment, before t11, a third turn-on voltage VON3 may be applied to the center dummy line CENTER DUMMY LINE. The third turn-on voltage VON3 may be a voltage for turning on the center dummy cells connected to the center dummy line CENTER DUMMY LINE.

Thereafter, the voltage applied to the center dummy line CENTER DUMMY LINE is interconnected with the voltage applied to the unselected drain select line UNSELECTED_DSL which does not share the cell string with the selected drain select line SELECTED_DSL (unshared string), and thus a fourth turn-on voltage VON4 may be applied to the center dummy line CENTER DUMMY LINE at t11 to t12. The fourth turn-on voltage VON4 (e.g., negative voltage) may be a voltage lower than the third turn-on voltage VON3 (e.g., ground voltage) and may be a voltage for turning on center dummy cells connected to the center dummy line CENTER DUMMY LINE. In addition, the fourth turn-on voltage VON4 may be a voltage that is not affected when programmed to word lines adjacent to the center dummy line CENTER DUMMY LINE.

In an embodiment, during the equalizing operation, the fourth turn-on voltage VON4 may be applied to the center dummy line CENTER DUMMY LINE at t15 to t16. That is, also during the equalizing operation, the voltage applied to the center dummy line CENTER DUMMY LINE may be interconnected with the voltage applied to the unselected drain select line UNSELECTED_DSL which does not share the cell string with the selected drain select line SELECTED_DSL (unshared string).

Figure 14:
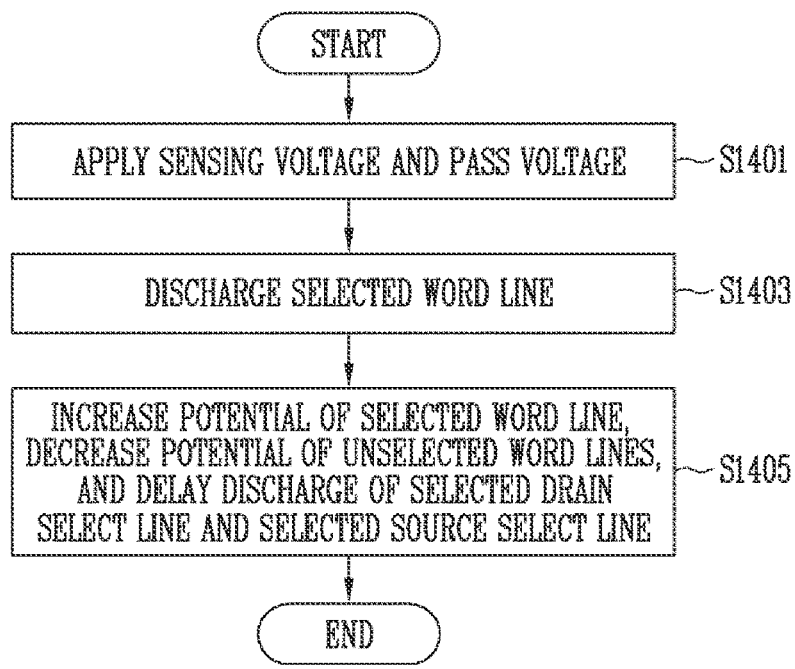
FIG. 14 is a diagram illustrating an operation of a memory device according to an embodiment of the present disclosure.

FIG. 14 is a diagram illustrating an operation of a memory device according to an embodiment of the present disclosure.

Referring to FIG. 14, in step S1401, during the sensing operation, the memory device may apply the sensing voltage to the selected word line and the pass voltage to the unselected word lines. When the sensing operation is the read operation, the sensing voltage may be the read voltage, and when the sensing operation is the verify operation, the sensing voltage may be the verify voltage.

In an embodiment, when the sensing voltage and the pass voltage are applied, the turn-on voltage may be applied to the selected drain select line and the selected source select line. The turn-on voltage may be a voltage capable of turning on the drain select transistors connected to the selected drain select line and the source select transistors connected to the selected source select lines. That is, the data programmed to the memory cells may be sensed through the bit line, by turning on the transistors connected to the selected drain select line and the selected source select line.

In step S1403, the memory device may discharge the selected word line. That is, when the data programmed to the selected memory cells is sensed by applying the sensing voltage to the selected word line, the selected word line may be discharged.

In step S1405, the memory device may delay the discharge of the selected drain select line and the selected source select line while increasing the potential of the selected word line and decreasing the potential of the unselected word lines.

For example, after the memory device senses the memory cells, the equalizing operation may be performed. During the equalizing operation, the potentials of the selected word line and the unselected word lines may be set to be the same. Thereafter, when the potentials of the selected word line and the unselected word lines are set to be the same, the selected word line and the unselected word lines may be simultaneously discharged.

In the present disclosure, during the equalizing operation, the memory device may simultaneously change the potential of the selected word line and the potential of the unselected word line, not only the potential of the selected word line. That is, the memory device may set the potential of the selected word line and the potential of the unselected word line to be the same by increasing the potential of the selected word line from the ground voltage (0V) and decreasing the potential of the unselected word lines from the pass voltage.

Furthermore, during the equalizing operation, the discharge may be delayed without discharging the selected drain select line and the selected source select line. That is, when the memory device performs the sensing operation, the memory device may maintain the turn-on voltage applied to the selected drain select line and the selected source select line until a specific time after the equalizing operation is started.

By delaying the discharge of the selected drain select line and the selected source select line, the charge in the floated channel may be discharged, and the channel negative boosting phenomenon may be prevented, or in some embodiments mitigated.

Figure 15:
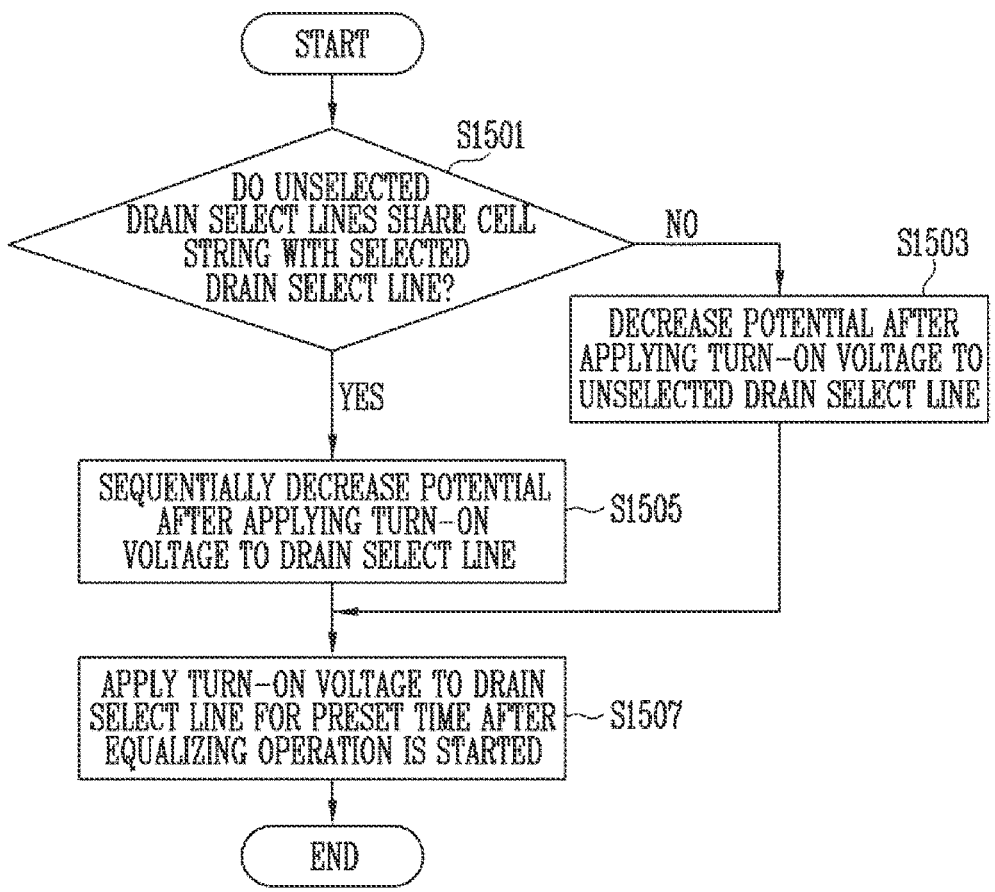
FIG. 15 is a diagram illustrating an operation of a memory device according to an embodiment of the present disclosure.

FIG. 15 is a diagram illustrating an operation of a memory device according to an embodiment of the present disclosure.

Referring to FIG. 15, in step S1501, when the memory device applies the sensing voltage to the selected word line and the pass voltage to the unselected word lines during the sensing operation, the memory device may determine whether the unselected drain select line shares the cell string with the selected drain select line. Here, the selected drain select line and the unselected drain select line sharing the cell string may be lines connected to the cell string through one source select line, and the selected drain select line and the unselected drain select line which do not share the cell string may be lines which are not connected to the cell string through one source select line.

When the unselected drain select lines do not share the cell string with the selected drain select line (N), the operation may proceed to step S1503, and when the unselected drain select lines share the cell string with the selected drain select line (Y), the operation may proceed to step S1505. When the unselected drain select lines share the cell string with the selected drain select line (shared string), the channel negative boosting may occur together in the shared cell string due to turn-on or turn-off of the transistor connected to the selected drain select line, and thus this is required to be distinguished.

In an embodiment, when the unselected drain select lines do not share the cell string with the selected drain select line (N), in step S1503, the memory device may apply a turn-on voltage to the unselected drain select line, and then may decrease the potential of the unselected drain select line. At this time, the voltage applied to the unselected drain select line may be applied only while the sensing voltage is applied to the selected word line.

In an embodiment, when the unselected drain select lines share the cell string with the selected drain select line (Y), in step S1505, the memory device may apply a turn-on voltage to the unselected drain select line, and then may sequentially decrease the potential of the unselected drain select line. That is, when the unselected drain select lines share the cell string with the selected drain select line, since the channel negative boosting may occur together, the charge in the channel may be moved to an unselected drain select line side by sequentially decreasing the potential of the unselected drain select line.

In an embodiment, after voltage is applied to the unselected drain select lines according to whether the unselected drain select lines share the cell string with the selected drain select line, the voltage applied to the unselected drain select lines may be controlled in the equalizing operation.

In step S1507, the memory device may apply a turn-on voltage to the unselected drain select line for a preset time after the equalizing operation is started. At this time, the memory device may turn on the drain select transistors connected to the unselected drain select line only for a preset time regardless of whether the unselected drain select lines share the cell string with the selected drain select line.

In an embodiment, even after the equalizing operation is started, the turn-on voltage may be applied to the selected drain select line and the unselected drain select lines, and thus the charge in the channel may be moved to the drain select line side. Therefore, the channel negative boosting may be prevented, or in some embodiments mitigated.

Figure 16:
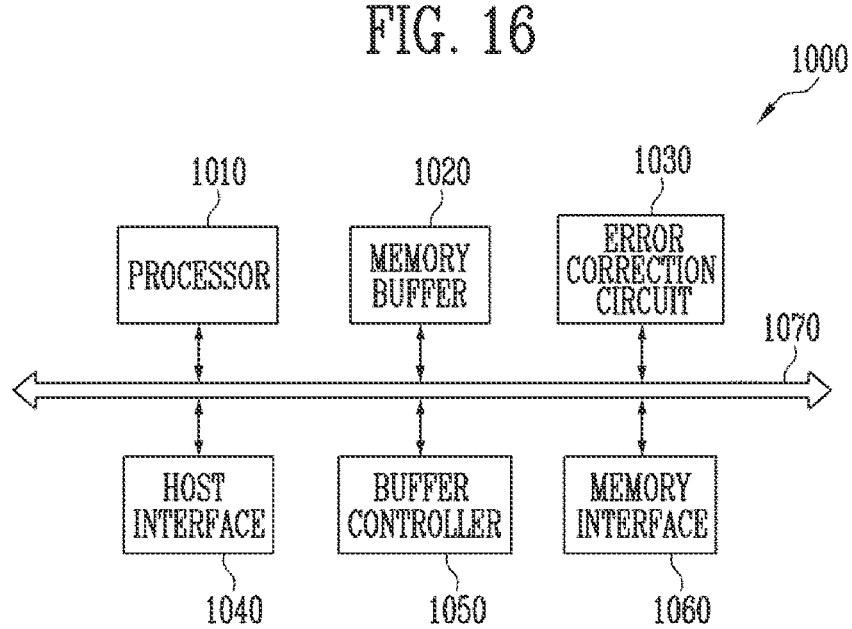
FIG. 16 is a diagram illustrating another embodiment of a memory controller of FIG. 1.

FIG. 16 is a diagram illustrating another embodiment of the memory controller of FIG. 1.

The memory controller 1000 is connected to a host and the memory device. The memory controller 1000 is configured to access the memory device in response to the request from the host. For example, the memory controller 1000 is configured to control write, read, erase, and background operations of the memory device. The memory controller 1000 is configured to provide an interface between the memory device and the host. The memory controller 1000 is configured to drive firmware for controlling the memory device.

Referring to FIG. 16, the memory controller 1000 may include a processor 1010, a memory buffer 1020, an error correction circuit (ECC) 1030, a host interface 1040, a buffer controller (or buffer control circuit) 1050, a memory interface 1060, and a bus 1070.

The bus 1070 may be configured to provide a channel between components of the memory controller 1000.

The processor 1010 may control overall operations of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of the FTL. The processor 1010 may translate the LBA provided by the host into the PBA through the FTL. The FTL may receive the LBA by using a mapping table and translate the LBA into the PBA. An address mapping method of the flash translation layer include a plurality of mapping methods according to a mapping unit. A representative address mapping method includes a page mapping method, a block mapping method, and a hybrid mapping method.

The processor 1010 is configured to randomize data received from the host. For example, the processor 1010 may randomize the data received from the host using a randomizing seed. The randomized data is provided to the memory device as data to be stored and is programmed to the memory cell array.

The processor 1010 may perform the randomization and the de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include a static RAM (SRAM) or a dynamic RAM (DRAM).

The error correction circuit 1030 may perform error correction. The error correction circuit 1030 may perform error correction encoding (ECC encoding) based on data to be written to the memory device through memory interface 1060. The error correction encoded data may be transferred to the memory device through the memory interface 1060. The error correction circuit 1030 may perform error correction decoding (ECC decoding) on the data received from the memory device through the memory interface 1060. For example, the error correction circuit 1030 may be included in the memory interface 1060 as a component of the memory interface 1060.

The host interface 1040 is configured to communicate with an external host under control of the processor 1010. The host interface 1040 may be configured to perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI express), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

For example, the memory controller 1000 might not include the memory buffer 1020 and the buffer controller 1050.

For example, the processor 1010 may control the operation of the memory controller 1000 using codes. The processor 1010 may load the codes from a nonvolatile memory device (for example, a read only memory) provided inside the memory controller 1000. As another example, the processor 1010 may load the codes from the memory device through the memory interface 1060.

For example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other and might not interfere with each other or affect each other. The data bus may be connected to the host interface 1040, the buffer controller 1050, the error correction circuit 1030, and the memory interface 1060. The control bus may be connected to the host interface 1040, the processor 1010, the buffer controller 1050, the memory buffer 1020, and the memory interface 1060.

Figure 17:
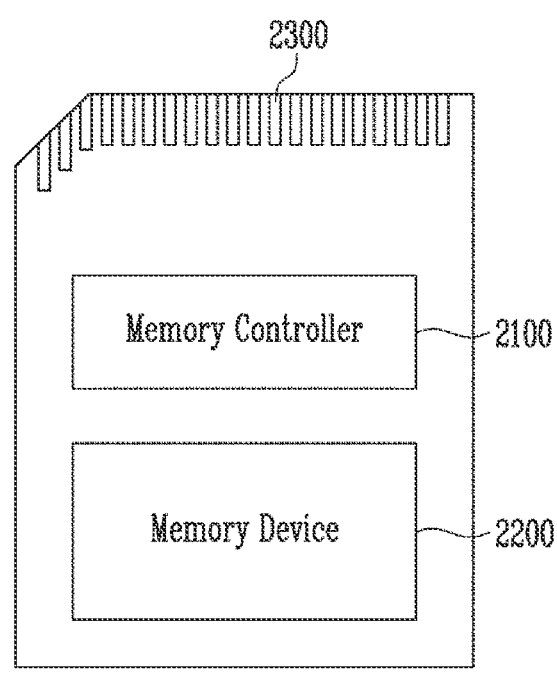
FIG. 17 is a block diagram illustrating a memory card system to which a storage device according to an embodiment of the present disclosure is applied.

FIG. 17 is a block diagram illustrating a memory card system to which the storage device according to an embodiment of the present disclosure is applied.

Referring to FIG. 17, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and the host. The memory controller 2100 is configured to drive firmware for controlling the memory device 2200. The memory device 2200 may be implemented equally to the memory device 100 of FIG. 1 described with reference to FIG. 1.

As an example, the memory controller 2100 may include components such as a random access memory (RAM), a processor, a host interface, a memory interface, and an error correction circuit.

The memory controller 2100 may communicate with an external device through the connector 2300. The memory controller 2100 may communicate with an external device (for example, the host) according to a specific communication standard. As an example, the memory controller 2100 is configured to communicate with an external device through at least one of various communication standards such as a universal serial bus (USB), a multi-media card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. As an example, the connector 2300 may be defined by at least one of the various communication standards described above.

As an example, the memory device 2200 may be implemented as various nonvolatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin transfer torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

In an embodiment, the memory device 2200 may perform the sensing operation. The sensing operation may be the read operation or the verify operation. When the memory device 2200 performs the sensing operation, the memory device 2200 may control the voltage applied to the plurality of lines connected to the memory block.

For example, when the sensing operation is started, the memory device 2200 may apply the sensing voltage to the selected word line among the plurality of lines connected to the memory block and the pass voltage to the unselected word lines. At this time, the memory device 2200 may control the voltages applied to the drain select lines and the source select lines together among the plurality of lines connected to the memory block.

For example, when the memory device 2200 applies the sensing voltage to the selected word line, the memory device 2200 may apply a turn-on voltage to the selected drain select line and the selected source select line. The turn-on voltage applied to the selected drain select line and the selected source select line may be maintained for a preset time also after the sensing operation is ended and the equalizing operation is started.

In addition, when the memory device 2200 applies the sensing voltage to the selected word line, the memory device 2200 may control the voltage applied to the unselected drain select lines based on whether the unselected drain select lines share the cell string with the selected drain select line.

For example, in the case of the unselected drain select line sharing the cell string with the selected drain select line, the memory device 2200 may sequentially decrease the turn-on voltage applied to the unselected drain select line. By sequentially decreasing the turn-on voltage applied to the unselected drain select line, the charge in the channel may be moved to the unselected drain select line side, and thus the channel negative boosting may be prevented, or in some embodiments mitigated.

In the case of the unselected drain select line which does not share the cell string with the selected drain select line, the memory device 2200 may apply the turn-on voltage applied to the unselected drain select line only while the sensing voltage is applied to the selected word line.

In an embodiment, when the memory device 2200 performs the equalizing operation after the sensing operation, the memory device 2200 may control a voltage applied to the plurality of lines connected to the memory block.

For example, when the equalizing operation is started, the memory device 2200 may control the potentials of the selected word line and the unselected word lines to be the same by increasing the potential of the selected word line among the plurality of lines connected to the memory block from 0V to an equalizing voltage level and decreasing the potential of the unselected word lines from a pass voltage level to the equalizing voltage level. At this time, the memory device 2200 may control the voltage applied to the unselected drain select lines together among the plurality of lines connected to the memory block.

For example, when the memory device 2200 sets the potentials of the selected word line and the unselected word lines to be the same, the memory device 2200 may apply the turn-on voltage to the unselected drain select lines for a preset time. That is, in a situation in which the potentials of the word lines increase or decrease during the equalizing operation, by turning on the drain select transistors connected to the unselected drain select lines, the charge in the channel may be moved to the unselected drain select lines side.

In an embodiment, the memory device 2200 may control the voltage applied to the center dummy line. The center dummy line may be a line connected to the cell string between stacks in two or more stack structures.

The memory device 2200 may control the voltage applied to the center dummy line so as to be interconnected with the voltage applied to the unselected drain select line which does not share the cell string with the selected drain select line. For example, the voltage applied to the center dummy line may be decreased when the turn-on voltage is applied to the unselected drain select line which does not share the cell string with the selected drain select line.

Figure 18:
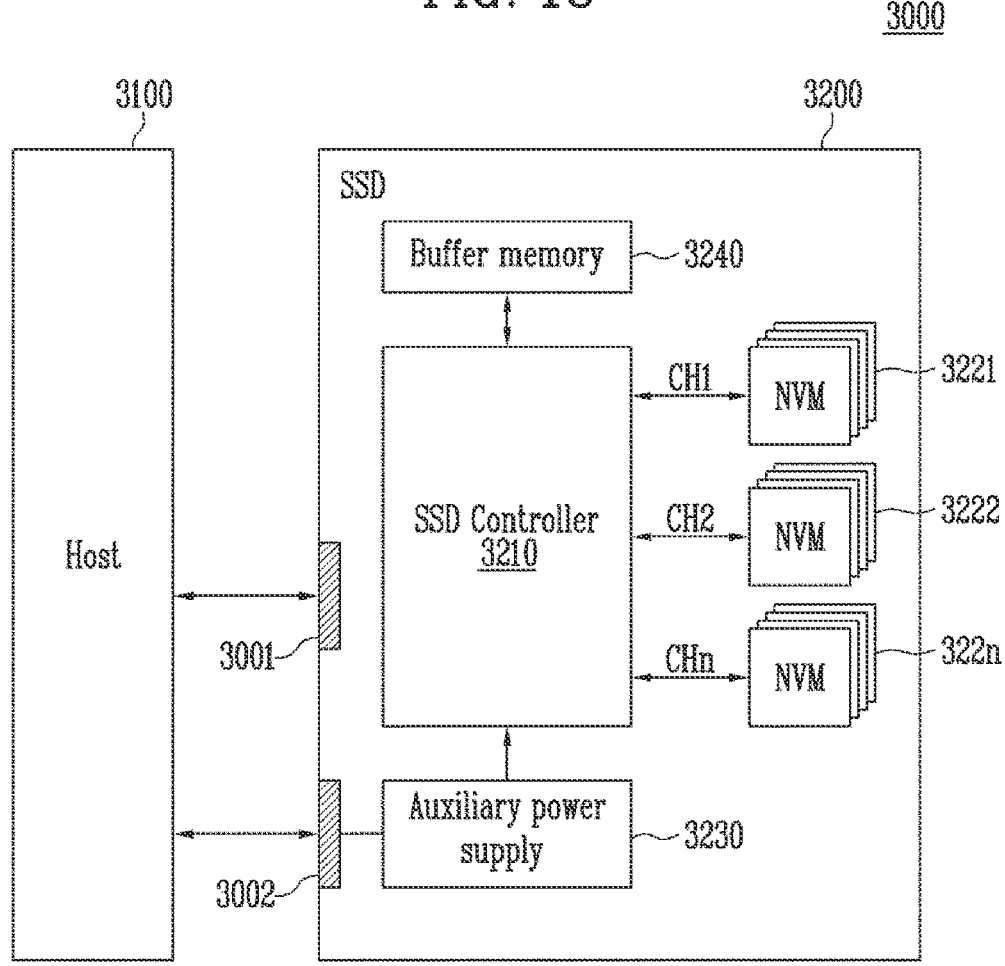
FIG. 18 is a block diagram illustrating, for example, a solid state drive (SSD) system to which a storage device according to an embodiment of the present disclosure is applied.

FIG. 18 is a block diagram illustrating, for example, a solid state drive (SSD) system to which the storage device according to an embodiment of the present disclosure is applied.

Referring to FIG. 18, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

In an embodiment, the SSD controller 3210 may perform a function of the memory controller 200 of FIG. 1 described with reference to FIG. 1.

The SSD controller 3210 may control the plurality of flash memories 3221 to 322n in response to the signal SIG received from the host 3100. As an example, the signal SIG may be signals based on an interface between the host 3100 and the SSD 3200. For example, the signal SIG may be a signal defined by at least one of interfaces such as a universal serial bus (USB), a multi-media card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. As an example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, an LPDDR SDRAM, and a GRAM, or a nonvolatile memory such as an FRAM, a ReRAM, an STT-MRAM, and a PRAM.

In an embodiment, the SSD 3200 may perform a sensing operation on the plurality of flash memories 3221 to 322n. The sensing operation may be the read operation or the verify operation. When the SSD 3200 performs the sensing operation, the SSD 3200 may control a voltage applied to a plurality of lines connected to a memory block included in the plurality of flash memories 3221 to 322n.

For example, when the sensing operation is started, the SSD 3200 may apply the sensing voltage to a selected word line among the plurality of lines connected to the memory block and the pass voltage to unselected word lines. At this time, the SSD 3200 may control voltages applied to drain select lines and source select lines together among the plurality of lines connected to the memory block.

For example, when the SSD 3200 applies the sensing voltage to the selected word line, the SSD 3200 may apply a turn-on voltage to a selected drain select line and a selected source select line. The turn-on voltage applied to the selected drain select line and the selected source select line may be maintained for a preset time also after the sensing operation is ended and the equalizing operation is started.

In addition, when the SSD 3200 applies the sensing voltage to the selected word line, the SSD 3200 may control a voltage applied to unselected drain select lines based on whether the unselected drain select lines share the cell string with the selected drain select line.

For example, in a case of the unselected drain select line sharing the cell string with the selected drain select line, the SSD 3200 may sequentially decrease the turn-on voltage applied to the unselected drain select line. By sequentially decreasing the turn-on voltage applied to the unselected drain select line, the charge in the channel may be moved to an unselected drain select line side, and thus the channel negative boosting may be prevented, or in some embodiments mitigated.

In a case of the unselected drain select line which does not share the cell string with the selected drain select line, the SSD 3200 may apply the turn-on voltage applied to the unselected drain select line only while the sensing voltage is applied to the selected word line.

In an embodiment, when the SSD 3200 performs the equalizing operation after the sensing operation, the SSD 3200 may control a voltage applied to the plurality of lines connected to the memory block.

For example, when the equalizing operation is started, the SSD 3200 may control potentials of the selected word line and the unselected word lines to be the same by increasing the potential of the selected word line among the plurality of lines connected to the memory block from 0V to the equalizing voltage level and decreasing the potential of the unselected word lines from the pass voltage level to the equalizing voltage level. At this time, the SSD 3200 may control the voltage applied to the unselected drain select lines together among the plurality of lines connected to the memory block.

For example, when the SSD 3200 sets the potentials of the selected word line and the unselected word lines to be the same, the SSD 3200 may apply the turn-on voltage to the unselected drain select lines for a preset time. That is, in a situation in which the potentials of the word lines increase or decrease during the equalizing operation, by turning on the drain select transistors connected to the unselected drain select lines, the charge in the channel may be moved to the unselected drain select lines side.

In an embodiment, the SSD 3200 may control the voltage applied to the center dummy line. The center dummy line may be a line connected to the cell string between stacks in two or more stack structures.

The SSD 3200 may control the voltage applied to the center dummy line so as to be interconnected with the voltage applied to the unselected drain select line which does not share the cell string with the selected drain select line. For example, the voltage applied to the center dummy line may be decreased when the turn-on voltage is applied to the unselected drain select line which does not share the cell string with the selected drain select line.

Figure 19:
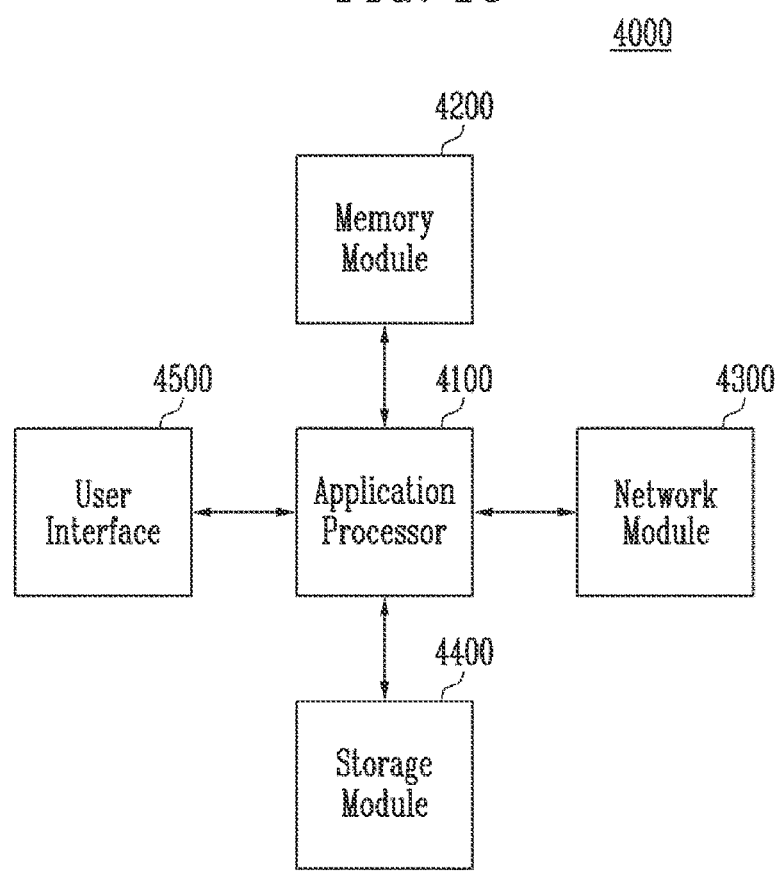
FIG. 19 is a block diagram illustrating a user system to which a storage device according to an embodiment of the present disclosure is applied.

FIG. 19 is a block diagram illustrating a user system to which the storage device according to an embodiment of the present disclosure is applied.

Referring to FIG. 19, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and WI-FI. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a nonvolatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of nonvolatile memory devices, and the plurality of nonvolatile memory devices may operate identically to the memory device described with reference to FIGS. 2 to 5. The storage module 4400 may operate identically to the storage device 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

In an embodiment, the storage module 4400 may perform a sensing operation. The sensing operation may be the read operation or the verify operation. When the storage module 4400 performs the sensing operation, the storage module 4400 may control a voltage applied to a plurality of lines connected to a memory block included in the storage module 4400.

For example, when the sensing operation is started, the storage module 4400 may apply the sensing voltage to a selected word line among the plurality of lines connected to the memory block and the pass voltage to unselected word lines. At this time, the storage module 4400 may control voltages applied to drain select lines and source select lines together among the plurality of lines connected to the memory block.

For example, when the storage module 4400 applies the sensing voltage to the selected word line, the storage module 4400 may apply a turn-on voltage to a selected drain select line and a selected source select line. The turn-on voltage applied to the selected drain select line and the selected source select line may be maintained for a preset time also after the sensing operation is ended and the equalizing operation is started.

In addition, when the storage module 4400 applies the sensing voltage to the selected word line, the storage module 4400 may control a voltage applied to unselected drain select lines based on whether the unselected drain select lines share the cell string with the selected drain select line.

For example, in a case of the unselected drain select line sharing the cell string with the selected drain select line, the storage module 4400 may sequentially decrease the turn-on voltage applied to the unselected drain select line. By sequentially decreasing the turn-on voltage applied to the unselected drain select line, the charge in the channel may be moved to an unselected drain select line side, and thus the channel negative boosting may be prevented, or in some embodiments mitigated.

In a case of the unselected drain select line which does not share the cell string with the selected drain select line, the storage module 4400 may apply the turn-on voltage applied to the unselected drain select line only while the sensing voltage is applied to the selected word line.

In an embodiment, when the storage module 4400 performs the equalizing operation after the sensing operation, the storage module 4400 may control a voltage applied to the plurality of lines connected to the memory block.

For example, when the equalizing operation is started, the storage module 4400 may control potentials of the selected word line and the unselected word lines to be the same by increasing the potential of the selected word line among the plurality of lines connected to the memory block from 0V to the equalizing voltage level and decreasing the potential of the unselected word lines from the pass voltage level to the equalizing voltage level. At this time, the storage module 4400 may control the voltage applied to the unselected drain select lines together among the plurality of lines connected to the memory block.

For example, when the storage module 4400 sets the potentials of the selected word line and the unselected word lines to be the same, the storage module 4400 may apply the turn-on voltage to the unselected drain select lines for a preset time. That is, in a situation in which the potentials of the word lines increase or decrease during the equalizing operation, by turning on the drain select transistors connected to the unselected drain select lines, the charge in the channel may be moved to the unselected drain select lines side.

In an embodiment, the storage module 4400 may control the voltage applied to the center dummy line. The center dummy line may be a line connected to the cell string between stacks in two or more stack structures.

The storage module 4400 may control the voltage applied to the center dummy line so as to be interconnected with the voltage applied to the unselected drain select line which does not share the cell string with the selected drain select line. For example, the voltage applied to the center dummy line may be decreased when the turn-on voltage is applied to the unselected drain select line which does not share the cell string with the selected drain select line.

What is claimed is:

1. A memory device comprising:
   a memory block connected to a plurality of lines;
   a peripheral circuit configured to perform a sensing operation on selected memory cells connected to a selected word line among the plurality of lines; and
   control logic configured to control voltages applied to drain select lines, source select lines, and word lines between the drain select lines and the source select lines among the plurality of lines, during the sensing operation and an equalizing operation performed after the sensing operation,
   wherein the control logic controls a voltage applied to an unselected drain select line according to whether a cell string is shared with a selected drain select line among the drain select lines, during the sensing operation.

2. The memory device of claim 1, wherein the sensing operation is a read operation or a verify operation.

3. The memory device of claim 1, wherein the unselected drain select line sharing the cell string with the selected drain select line shares the cell string with the selected drain select line through same source select line.

4. The memory device of claim 1, wherein when the unselected drain select line is a line except for a line sharing the cell string with the selected drain select line, the control logic controls to apply turn-on voltages for turning on transistors connected to the unselected drain select line only when a sensing voltage is applied to the selected word line.

5. The memory device of claim 1, wherein when the unselected drain select line is a line sharing the cell string with the selected drain select line, the control logic sequentially decreases turn-on voltages for turning on transistors respectively connected to the unselected drain select lines from when a sensing voltage is applied to the selected word line.

6. The memory device of claim 1, wherein the control logic controls to apply turn-on voltages for turning on transistors respectively connected to the selected drain select line and a selected source select line, to the selected drain select line among the drain select lines and the selected source select line among the source select lines from when a sensing voltage is applied to the selected word line to a preset first time after the equalizing operation is started.

7. The memory device of claim 1, wherein the control logic increases a voltage of the selected word line from a ground voltage to a first voltage, and decreases voltages of unselected word lines except for the selected word line among the word lines from a pass voltage applied during the sensing operation to the first voltage, during the equalizing operation.

8. The memory device of claim 1, wherein the control logic controls to apply turn-on voltages for turning on drain select transistors respectively connected to the drain select lines, to the drain select lines for a preset second time, during the equalizing operation.

9. The memory device of claim 1, wherein when the memory block has a plurality of stack structures, a line positioned in a middle of the word lines is a center dummy line, and
   the control logic controls a voltage applied to the center dummy line according to the voltage applied to the unselected drain select line except for a line sharing the cell string with the selected drain select line among the drain select lines, during the sensing operation and the equalizing operation.

10. The memory device of claim 9, wherein the control logic decreases the voltage applied to the center dummy line when a turn-on voltage is applied to the unselected drain select line except for the line sharing the cell string with the selected drain select line.

11. A memory device comprising:
    a memory block connected to a plurality of lines;
    a peripheral circuit configured to perform a sensing operation on selected memory cells connected to a selected word line among the plurality of lines;

a drain select line controller configured to control voltages applied to drain select lines among the plurality of lines, during the sensing operation and an equalizing operation performed after the sensing operation;

a source select line controller configured to control voltages applied to source select lines among the plurality of lines;

a word line controller configured to control a voltage applied to word lines between the drain select lines and the source select lines among the plurality of lines; and a dummy line controller configured to control a voltage applied to a center dummy line positioned in a middle of the word lines, when the memory block has a plurality of stack structures, wherein the drain select line controller controls a voltage applied to an unselected drain select line according to whether a cell string is shared with a selected drain select line among the drain select lines, during the sensing operation.

12. The memory device of claim 11, wherein when the unselected drain select line is a line except for a line sharing the cell string with the selected drain select line, the drain select line controller controls to apply turn-on voltages for turning on transistors connected to the unselected drain select line only when a sensing voltage is applied to the selected word line.

13. The memory device of claim 11, wherein when the unselected drain select line is a line sharing the cell string with the selected drain select line, the drain select line controller sequentially decreases turn-on voltages for turning on transistors respectively connected to the unselected drain select lines from when a sensing voltage is applied to the selected word line.

14. The memory device of claim 11, wherein from when a sensing voltage is applied to the selected word line to a preset third time after the equalizing operation is started, the drain select line controller controls to apply turn-on voltages for turning on transistors connected to the selected drain select line among the drain select lines, to the selected drain select line, and the source select line controller controls to apply turn-on voltages for turning on transistors connected to a selected source select line among the source select lines, to the selected source select line.

15. The memory device of claim 11, wherein the drain select line controller controls to apply turn-on voltages for turning on drain select transistors respectively connected to the drain select lines, to the drain select lines for a preset fourth time, during the equalizing operation.

16. The memory device of claim 11, wherein the dummy line controller controls a voltage applied to the center dummy line according to the voltage applied to the unselected drain select line except for a line sharing the cell string with the selected drain select line among the drain select lines, during the sensing operation and the equalizing operation.

17. The memory device of claim 16, wherein the dummy line controller decreases the voltage applied to the center dummy line when a turn-on voltage is applied to the unselected drain select line except for the line sharing the cell string with the selected drain select line.

18. A method of operating a memory device including a memory block connected to a plurality of lines, the method comprising:

applying a sensing voltage to a selected word line and applying pass voltages to unselected word lines among the plurality of lines in order to perform a sensing operation of sensing selected memory cells connected to the selected word line among the plurality of lines; and applying voltages to drain select lines among the plurality of lines, when applying the sensing voltage and the pass voltage, wherein a voltage applied to an unselected drain select line is set differently according to whether a cell string is shared with a selected drain select line among the drain select lines.

19. The method of claim 18, wherein in applying the voltages to the drain select lines, when the unselected drain select line is a line except for a line sharing the cell string with the selected drain select line, turn-on voltages for turning on transistors connected to the unselected drain select line is applied only when a sensing voltage is applied to the selected word line, and when the unselected drain select line is the line sharing the cell string with the selected drain select line, the turn-on voltage applied to the unselected drain select line is sequentially decreased from when the sensing voltage is applied to the selected word line.

20. The method of claim 18, wherein turn-on voltages for turning on transistors respectively connected to the selected drain select line and a selected source select line is applied to the selected drain select line and the selected source select line among source select lines from when the sensing voltage is applied to the selected word line to a preset fifth time after an equalizing operation performed after the sensing operation is started, and the turn-on voltages are applied to the drain select lines during the preset fifth time, during the equalizing operation.

* * * * *